(12) United States Patent
Iwamoto et al.

(10) Patent No.: US 6,903,418 B2
(45) Date of Patent: Jun. 7, 2005

(54) SEMICONDUCTOR DEVICE

(75) Inventors: Susumu Iwamoto, Nagano (JP);
Tatsuhiko Fujihira, Nagano (JP);
Katsunori Ueno, Nagano (JP);
Yasuhiko Onishi, Nagano (JP);
Takahiro Sato, Nagano (JP); Tatsuji Nagaoka, Nagano (JP)

(73) Assignee: Fuji Electric Device Technology Co., Ltd. (JP)

( * ) Notice: Subject to any disclaimer, the term of this patent is extended or adjusted under 35 U.S.C. 154(b) by 0 days.

(21) Appl. No.: 10/678,941

(22) Filed: Oct. 3, 2003

(65) Prior Publication Data

US 2004/0065921 A1 Apr. 8, 2004

Related U.S. Application Data

(62) Division of application No. 10/073,671, filed on Feb. 11, 2002, now Pat. No. 6,674,126.

(30) Foreign Application Priority Data

Feb. 9, 2001 (JP) ........................................ 2001-033408

(51) Int. Cl.$^7$ ........................................... H01L 29/772
(52) U.S. Cl. ..................... 257/342; 257/341; 257/339; 257/409; 257/492; 257/493
(58) Field of Search ................................. 257/341, 342, 257/339, 409, 492, 493, 135, 401

(56) References Cited

U.S. PATENT DOCUMENTS

| 4,754,310 | A | 6/1988 | Coe | 357/13 |
|---|---|---|---|---|
| 5,216,275 | A | 6/1993 | Chen | 257/493 |
| 5,438,215 | A | 8/1995 | Tihanyi | 257/401 |
| 6,066,878 | A | 5/2000 | Neilson | 257/342 |
| 6,081,009 | A | 6/2000 | Neilson | 257/341 |
| 6,184,555 | B1 | 2/2001 | Tihanyi et al. | 257/342 |
| 6,512,268 | B1 | 1/2003 | Ueno | 257/341 |
| 2003/0132450 | A1 * | 7/2003 | Minato et al. | 257/110 |

* cited by examiner

*Primary Examiner*—George Eckert
*Assistant Examiner*—Matthew Landau
(74) *Attorney, Agent, or Firm*—Rossi, Kimms & McDowell

(57) ABSTRACT

A semiconductor device facilitates obtaining a higher breakdown voltage in the portion of the semiconductor chip around the drain drift region and improving the avalanche withstanding capability thereof. A vertical MOSFET according to the invention includes a drain layer; a drain drift region on drain layer, drain drift region including a first alternating conductivity type layer; a breakdown withstanding region (the peripheral region of the semiconductor chip) on drain layer and around drain drift region, breakdown withstanding region providing substantially no current path in the ON-state of the MOSFET, breakdown withstanding region being depleted in the OFF-state of the MOSFET, breakdown withstanding region including a second alternating conductivity type layer, and an under region below a gate pad, and the under region including a third alternating conductivity type layer.

26 Claims, 14 Drawing Sheets

US 6,903,418 B2

SEMICONDUCTOR DEVICE

This application is a Division of Ser. No. 10/073,671 Feb. 11, 2002 U.S. Pat. No. 6,674,126.

FIELD OF THE INVENTION

The present invention relates to vertical power semiconductor devices such as MOSFET's (insulated gate field effect transistors), IGBT's (insulated gate bipolar transistors), bipolar transistors and diodes. Specifically, the present invention relates to vertical power semiconductor devices which facilitate realizing a high breakdown voltage and a high current capacity.

BACKGROUND

Semiconductor devices may be classified into lateral devices, which arrange the main electrodes thereof on one major surface and make a drift current flow in parallel to the major surface, and vertical devices, which distribute the main electrodes thereof on two major surfaces facing opposite to each other and makes a drift current flow in perpendicular to the major surfaces. In a vertical semiconductor device, a drift current flows in the thickness direction of the semiconductor chip (vertically) in the ON-state of the semiconductor device and depletion layers expand also in the thickness direction of the semiconductor chip (vertically) in the OFF-state of the semiconductor device. FIG. 13, for example, is a cross sectional view of a conventional planar-type n-channel vertical MOSFET.

Referring now to FIG. 13, the vertical MOSFET includes a drain electrode 18 on the back surface of a semiconductor chip; an n$^+$-type drain layer 11 with low electrical resistance in electrical contact with drain electrode 18; a very resistive n-type drain drift layer 12 on n$^+$-type drain layer 11; p-type base regions 13 formed, as channel diffusion layers, selectively in the surface portion of n-type drain drift layer 12; a heavily doped n$^+$-type source region 14 formed selectively in the surface portion of p-type base region 13; a heavily doped p$^+$-type contact region 19 formed selectively in the surface portion of p-type base region 13 for realizing ohmic contact; a polycrystalline silicon gate electrode layer 16 above the extended portion of p-type base region 13 extended between n$^+$-type source region 14 and n-type drain drift layer 12 with a gate insulation film 15 interposed therebetween; and a source electrode layer 17 in contact with n$^+$-type source regions 14 and p$^+$-type contact regions 19. Hereinafter, the very resistive drain drift layer will be referred to as an "n-type drift layer" or simply as a "drift layer".

In the vertical semiconductor device as described above, n-type drift layer 12 works as a layer, through which a drift current flows vertically in the ON state of the MOSFET. In the OFF-state of the MOSFET, n-type drift layer 12 is depleted by the depletion layers expanding in the depth direction thereof (vertically) from the pn-junctions between drift layer 12 and p-type base regions 13, resulting in a high breakdown voltage.

Thinning very resistive n-type drift layer 12, that is shortening the drift current path, facilitates substantially reducing the on-resistance (the resistance between the drain and the source), since the drift resistance in the ON-state of the semiconductor device is reduced. However, thinning the very resistive n-type drift layer 12 narrows the width between the drain and the base, for which depletion layers expand from the pn-junctions between drift layer 12 and p-type base regions 13. Due to the narrow expansion width of the depletion layers, the depletion electric field strength soon reaches the maximum (critical) value for silicon. Therefore, breakdown is caused at a voltage lower than the designed breakdown voltage of the semiconductor device.

A high breakdown voltage is obtained by thickening n-type drift layer 12. However, a thick n-type drift layer 12 inevitably causes high on-resistance, which further causes on-loss increase. In other words, there exists a tradeoff relation between the on-resistance (current capacity) and the breakdown voltage. The tradeoff relation between the on-resistance (current capacity) and the breakdown voltage exists in the other semiconductor devices, which include a drift layer, such as IGBT's, bipolar transistors and diodes.

European Patent 0 053 854, U.S. Pat. No. 5,216,275, U.S. Pat. No. 5,438,215, Japanese Unexamined Laid Open Patent Application H09-266311 and Japanese Unexamined Laid Open Patent Application H10-223896 disclose semiconductor devices, which facilitate reducing the tradeoff relation between the on-resistance and the breakdown voltage. The drift layers of the disclosed semiconductor devices are formed of an alternating-conductivity-type drain drift layer including heavily doped n-type regions and heavily doped p-type regions arranged alternately. Hereinafter, the alternating-conductivity-type drain drift layer will be referred to sometimes as the "first alternating conductivity type layer" or simply as the "drain drift region".

FIG. 14 is a cross sectional view of the vertical MOSFET disclosed in U.S. Pat. No. 5,216,275. Referring now to FIG. 14, the drift layer of the vertical MOSFET is not a uniform n-type layer (impurity diffusion layer), but a drain drift region 22 formed of thin n-type drift current path regions 22a and thin p-type partition regions 22b laminated alternately. Hereinafter, the n-type drift current path regions will be referred to as the "n-type drift regions". The n-type drift regions 22a and p-type partition regions 22b are shaped with respective thin layers extending vertically. The bottom of p-type base region 13 is connected with p-type partition region 22b. The n-type drift region 22a is extended between adjacent p-type base regions 13 and 13. Although alternating conductivity type layer 22 is heavily doped, a high breakdown voltage is obtained, since alternating conductivity type layer 22 is depleted quickly by the depletion layers expanding laterally in the OFF-state of the MOSFET from the pn-junctions extending vertically across alternating conductivity type layer 22. Hereinafter, the semiconductor device which includes drain drift region 22 formed of an alternating conductivity type layer will be referred to as the "super-junction semiconductor device".

In the super-junction semiconductor device as described above, the breakdown voltage is high in the alternating conductivity type layer 22 (drain drift region) below p-type base regions 13 (active region of the semiconductor device) formed in the surface portion of the semiconductor chip. However, the breakdown voltage is low in the breakdown withstanding region around the alternating conductivity type layer 22 (drain drift region), since the depletion layer hardly expands outward from the pn-junction between the outermost p-type base region 13 and n-type drift region 22a or to the deep portion of the semiconductor chip, and since the depletion electric field strength soon reaches the critical value for silicon.

To obtain a high breakdown voltage in the breakdown withstanding region outside the outermost p-type base region 13, a conventional depletion electric field control means such as a guard ring formed on the breakdown withstanding region and a field plate formed on the insulation film may be employed. The breakdown voltage obtained by drain drift region 22 is higher than the breakdown voltage obtained by conventional single-layered drain drift layer 12. However, the provision of the alternating conductivity type layer makes it more difficult to obtain a higher breakdown voltage in the breakdown withstanding region by adding the conventional depletion electric field control means including the guard ring and the field plate. Therefore, the provision of the alternating conductivity type layer makes it more difficult to optimally design the additional means for correcting the depletion electric field strength in the breakdown withstanding region, and impairs the reliability of the semiconductor device. Thus, it has been impossible to fully realize the functions expectable to the super-junction semiconductor devices.

In power semiconductor devices, p-type base regions 13 are cells shaped with respective rings or respective stripes two-dimensionally to widen the channel width for obtaining a high current capacity. To reduce the wiring resistance, source electrode layer 17 is connected to $n^+$-type source regions 14 and $p^+$-type contact regions 19 via connection holes or connection trenches above p-type base region 13 of each cell. Source electrode layer 17 is a layer extending two-dimensionally and covering all the gate electrode layers 16 with an interlayer insulation film interposed therebetween. Although not illustrated in FIG. 14, the peripheral portion of the two-dimensionally extending source electrode layer 17 is extended outward from drain drift region 22 as a field plate. Although not illustrated in FIG. 14, gate electrode layer 16 for each cell is connected to an electrode for connecting gate electrode layers 16 to the outside (hereinafter referred to as a "gate pad"). The gate pad is positioned in the cutout formed on a side, at a corner, or in the central portion of source electrode layer 17 on the insulation film. At least a part of the gate pad is positioned in proximity to the field plate portion of source electrode layer 17 or surrounded by source electrode layer 17.

Dynamic avalanche breakdown caused by a reverse bias voltage generated at the instance of turn off, thereat carriers are remaining, is hardly caused in the super-junction semiconductor device including drain drift region 22, since depletion layers expand quickly in drain drift region 22 at a low reverse bias voltage (around 50 V). If dynamic avalanche breakdown is caused in any portion on the side of the major surface of drain drift 22, excessive holes generated will be extracted quickly from the source power supply via the contact portions of source electrode layer 17, since any of the contact portions of source electrode layer 17 distributed to the respective cells is in proximity to the portion of alternating conductivity type layer 2, wherein the dynamic avalanche breakdown is caused.

However, when dynamic avalanche breakdown is caused below the gate pad or below the field plate, the excessive carriers are accumulated once on the boundary between the gate pad and the insulation film, and are then discharged at once toward the portion of the source electrode layer surrounding the gate pad, causing breakdown of the semiconductor device due to the generated heat and such causes. Therefore, the withstanding capability against dynamic avalanche breakdown is inevitably lower in the portions of the semiconductor chip below the gate pad than in the drain drift region, causing an unstable breakdown voltage.

In view of the foregoing, it would be desirable to provide a semiconductor device, which facilitates obtaining a breakdown voltage in the peripheral portion of the semiconductor chip higher than the breakdown voltage in the drain drift region without forming any guard ring nor any field plate on the semiconductor chip surface.

It would further be desirable to provide a semiconductor device, which facilitates preventing dynamic avalanche breakdown from causing under the gate electrode layers for controlling the ON and OFF of the semiconductor device inclusive of the gate pad or under the field plate, stabilizing the breakdown voltage thereof, and obtaining a high withstanding capability against dynamic avalanche breakdown.

SUMMARY OF THE INVENTION

The semiconductor device according to the invention is a super-junction semiconductor device including: a semiconductor chip having a first major surface and a second major surface facing opposite to the first major surface; a first electrode layer on the first major surface; a second electrode layer on the second major surface; an active region on the side of the first major surface, the active region being in electrical contact with the first electrode layer; a layer with low electrical resistance of a first conductivity type on the side of the second major surface, the layer with low electrical resistance being in electrical contact with the second electrode layer; a drain drift region between the first major surface and the layer with low electrical resistance, the drain drift region providing a vertical drift current path in the ON-state of the semiconductor device, the drain drift region being depleted in the OFF-state of the semiconductor device; the drain drift region including a first alternating conductivity type layer including vertically extending first semiconductor regions of the first conductivity type and vertically extending second semiconductor regions of a second conductivity type arranged alternately at a first pitch of repeating; and a breakdown withstanding region around the drain drift region, the breakdown withstanding region being between the first major surface and the layer with low electrical resistance, the breakdown withstanding region providing substantially no current path in the ON-state of the semiconductor device, the breakdown withstanding region being depleted in the OFF-state of the semiconductor device, the breakdown withstanding region including a second alternating conductivity type layer including vertically extending third semiconductor regions of the first conductivity type and vertically extending fourth semiconductor regions of the second conductivity type arranged alternately at a second pitch of repeating.

The structure described above is applicable to the vertical active semiconductor device which has three or more terminals. In the case of n-channel MOSFET's, the active region thereof includes source regions and channel diffusion regions. The first electrode layer is a source electrode layer, the second electrode layer a drain electrode layer, and the third electrode layer is a gate pad for connecting gate electrode layers to the outside. In the case of bipolar transistors, the second electrode layer is an emitter or a collector, and the third electrode layer is a control electrode for switching on and off the bipolar transistors.

The semiconductor device according to the invention advantageously includes a breakdown withstanding region formed around the drain drift region, the breakdown withstanding region being between the first major surface and the layer with low electrical resistance, the breakdown withstanding region including a second alternating conductivity type layer including vertically extending third semiconductor regions of the first conductivity type and vertically extending fourth semiconductor regions of the second conductivity type arranged alternately at a second repeating pitch.

The breakdown voltage of the semiconductor device according to the invention is high, since depletion layers expand in the OFF-state of the semiconductor device from very many pn-junctions not only to the drain drift region but also to the portion of the semiconductor chip outside the drain drift region and the deep portion of the semiconductor chip near the second major surface due to the provision of the second alternating conductivity type layer with a second repeating pitch which is narrower than a first repeating pitch in the breakdown withstanding region. Since the curved electric line of force extending from the side of the active region to the layer with low electrical resistance via the breakdown withstanding region is longer than the electric line of force extending from the active region on the side of the first major surface to the layer with low electrical resistance via the drain drift region, the electric field strength in the breakdown withstanding region is lower than that in the drain drift region even when the impurity concentrations in both regions are the same. Therefore, the breakdown voltage in the breakdown withstanding region is higher than that in the drain drift region. Since a high breakdown voltage is obtained in the breakdown withstanding region of the super-junction semiconductor device including a drain drift region formed of an alternating conductivity type layer, the structure of the alternating conductivity type layer in the drain drift region is optimized easily, a super-junction MOSFET is designed more freely, and the resulting MOSFET is a practical one.

The semiconductor device according to the invention includes a third electrode layer for controlling the ON and OFF of the semiconductor device above the first major surface with an insulation film interposed therebetween, at least a part of the third electrode layer being in close proximity to the first electrode layer; and an under region below the third electrode layer for controlling the ON and OFF of the semiconductor device, the under region including a third alternating conductivity type layer including vertically extending fifth semiconductor regions of the first conductivity type and vertically extending sixth semiconductor regions of the second conductivity type arranged alternately at a third pitch of repeating; and the third pitch of repeating being narrower than the first pitch of repeating. When the third electrode layer is in close proximity to the peripheral portion of the first electrode layer, the under region below the third electrode layer includes the portion of the semiconductor chip below the peripheral portion of the first electrode layer.

The third electrode layer is positioned on the insulation film and in the cutout formed on a side, at a corner or in the central portion of the first electrode layer. At least a part of the third electrode layer is in close proximity to the first electrode layer. Since the third pitch of repeating in the third alternating conductivity type layer below the third electrode layer is narrower than the first pitch of repeating in the drain drift region, the unit area is depleted more easily in the under region than in the drain drift region. Therefore, the breakdown voltage in the under region never determines the breakdown voltage of the semiconductor device according to the invention. Since depletion layer expand more quickly in the under region than in the drain drift region when the semiconductor device is switched off, the electric field strength in the under region is relaxed and carriers are expelled to the drain drift region. Therefore, dynamic avalanche breakdown is hardly caused in the under region below the third electrode layer. Since dynamic avalanche breakdown is caused in the drain drift region, dynamic avalanche breakdown is prevented from causing in the under region, a stable breakdown voltage is obtained, and a high withstanding capability against dynamic avalanche breakdown is obtained.

Since depletion layers expand more easily in the in the under region than in the drain drift region when the third alternating conductivity type layer is doped more lightly than the first alternating conductivity type layer, dynamic avalanche breakdown is further prevented from causing in the under region below the third electrode layer. Even when the third pitch of repeating is equal to or wider than the first pitch of repeating, dynamic avalanche breakdown is prevented from causing in the under region by doping the under region more lightly than the drain drift region considering the first and third pitches of repeating.

Advantageously, the second alternating conductivity type layer is doped more lightly than the first alternating conductivity type layer. When the second alternating conductivity type layer is doped more lightly than the first alternating conductivity type layer, the breakdown voltage of the semiconductor device is determined by the first alternating conductivity type layer in the drain drift region, and dynamic avalanche breakdown is prevented from causing in the breakdown withstanding region.

Advantageously, the semiconductor device according to the invention further includes a first well region of the second conductivity type connected electrically to the first electrode layer, the first well region covering the surface of the third alternating conductivity type layer on the side of the first major surface. Since all the sixth semiconductor regions of the second conductivity type in the third alternating conductivity type layer are biased surely at a reverse bias voltage, this structure facilitates expanding depletion layers from the pn-junctions of the third alternating conductivity type layer in the depth direction of the semiconductor chip, obtaining a high breakdown voltage in the under region, and preventing dynamic avalanche breakdown from causing more surely in the under region. Therefore, the withstanding capability against dynamic avalanche breakdown is improved. If dynamic avalanche breakdown is caused in the under region, the excessive holes caused will be extracted to the first electrode layer via the first well region for hole extraction without being accumulated on the boundary between the third electrode layer and the insulation film. Therefore, the MOSFET is not broken down by the heat generated and such causes.

Since it becomes difficult to deplete the entire third alternating conductivity type layer and the electric field tends to localize to the curved side of the first well region of the second conductivity type when the first well region of the second conductivity type covers a part of the third alternating conductivity type layer on the side of the first major surface, dynamic avalanche breakdown tends to be caused on the pn-junction (boundary) between the third and first alternating conductivity type layers.

To obviate this problem, the surface of the third alternating conductivity type layer on the side of the first major surface is preferably in contact with the bottom of the first well region. This structure facilitates depleting the third alternating conductivity type layer uniformly. When the third electrode layer is positioned on a side of the first electrode layer or at a corner of the first electrode layer, any of the sides of the first well region of the second conductivity type is connected to the end portion of the first alternating conductivity type layer or the second alternating conductivity type layer. When the third electrode layer is positioned in the central portion of the first electrode layer, all the sides of the first well region of the second conductivity type are connected to the end portions of the first alternating conductivity type layer. Therefore, the pn-junction which corresponds to the boundary between the third and first alternating conductivity type layers is connected to the first well region of the second conductivity type. This structure facilitates stabilizing the breakdown voltage of the semiconductor device, since dynamic avalanche breakdown is expelled to the drain drift region and since the pn-junction which corresponds to the boundary between the third and second alternating conductivity type layers is also connected to the first well region of the second conductivity type. It is preferable to connect the outermost second semiconductor region of the second conductivity type of the first alternating conductivity type layer with the first well region of the second conductivity type. This structure facilitates adjusting the charge balance between the between the outermost second semiconductor region of the second conductivity type of the first alternating conductivity type layer and the innermost fifth semiconductor region of the first conductivity type of the third alternating conductivity type layer adjacent to each other.

Advantageously, the pn-junctions in the second alternating conductivity type layer extend in parallel to the pn-junctions in the first alternating conductivity type layer. Advantageously, the pn-junctions in the second alternating conductivity type layer extend in perpendicular to the pn-junctions in the first alternating conductivity type layer. Advantageously, the pn-junctions in the third alternating conductivity type layer extend in parallel to the pn-junctions in the first alternating conductivity type layer. Advantageously, the pn-junctions in the third alternating conductivity type layer extend in perpendicular to the pn-junctions in the first alternating conductivity type layer. Advantageously, the first through sixth semiconductor regions of the first through third alternating conductivity type layer are shaped with respective stripes in a plane parallel to the first major surface or the second major surface. Alternatively, the semiconductor regions of the first conductivity type or the semiconductor regions of the second conductivity type may be shape with respective columns positioned at the lattice points of a trigonal lattice, a tetragonal lattice or a cubic lattice. Since the area of the pn-junctions per a unit area increases, the breakdown voltage is improved. The semiconductor regions of the first conductivity type and the semiconductor regions of the second conductivity type may be continuous diffusion regions, the impurity concentration thereof distributes uniformly. Advantageously, the semiconductor regions of the first conductivity type or the semiconductor regions of the second conductivity type may be formed by connecting unit diffusion regions scattered in the semiconductor chip vertically, since the alternating conductivity type layers are formed easily. The impurity concentration is the maximum at the center of each unit diffusion region and decreasing gradually as the position is spaced apart from the center of each unit diffusion region.

Since the third electrode layer is an electrode layer for controlling the ON and OFF of the semiconductor device, the configurations described above are applicable to the vertical active semiconductor device having three or more terminals.

The configurations according to the invention applicable to the vertical passive semiconductor device having two terminals will be described below.

According to a second aspect of the invention, there is provided a semiconductor device including: a semiconductor chip having a first major surface and a second major surface facing opposite to the first major surface; a first electrode layer on the first major surface having a first peripheral portion; a second electrode layer on the second major surface; an active region on the side of the first major surface, the active region being in electrical contact with the first electrode layer; a layer with low electrical resistance of a first conductivity type on the side of the second major surface, the layer with low electrical resistance being in electrical contact with the second electrode layer; a drain drift region between the first major surface and the layer with low electrical resistance, the drain drift region providing a vertical drift current path in the ON-state of the semiconductor device, the drain drift region being depleted in the OFF-state of the semiconductor device; the drain drift region including a first alternating conductivity type layer including vertically extending first semiconductor regions of the first conductivity type and vertically extending second semiconductor regions of a second conductivity type arranged alternately at a first pitch of repeating; a breakdown withstanding region around the drain drift region, the breakdown withstanding region being between the first major surface and the layer with low electrical resistance, the breakdown withstanding region providing substantially no current path in the ON-state of the semiconductor device, the breakdown withstanding region being depleted in the OFF-state of the semiconductor device, the breakdown withstanding region including a second alternating conductivity type layer including vertically extending third semiconductor regions of the first conductivity type and vertically extending fourth semiconductor regions of the second conductivity type arranged alternately at a second pitch of repeating; an under region below the first peripheral portion of the first electrode layer, the under region including a third alternating conductivity type layer including vertically extending fifth semiconductor regions of the first conductivity type and vertically extending sixth semiconductor regions of the second conductivity type arranged alternately at a third pitch of repeating; and the third pitch of repeating being narrower than the first pitch of repeating. Whether the semiconductor device includes a third electrode layer or not is not important.

The structure described above facilitates improving the breakdown voltage below the first peripheral portion of the first electrode layer and the withstanding capability against dynamic avalanche breakdown. Advantageously, the third alternating conductivity type layer is doped more lightly than the first alternating conductivity type layer.

Advantageously, the semiconductor device further includes a first well region of the second conductivity type connected electrically to the first electrode layer, the first well region covering the surface on the side of the first major surface of the third alternating conductivity type layer. The under region below the first peripheral portion of the first electrode layer is biased surely at the reverse bias voltage. Moreover, if dynamic avalanche breakdown is caused in the under region, the carriers caused will be extracted to the first electrode layer via the first well region of the second conductivity type and the semiconductor device is prevented from being broken down.

Advantageously, the first electrode layer further includes a second peripheral portion, below which the second alternating conductivity type layer is extended. Advantageously, the semiconductor device further includes a second well region of the second conductivity type connected electrically to the first electrode layer, the second well region covering the surface on the side of the first major surface of the extended portion of the second alternating conductivity type layer extended below the second peripheral portion of the first electrode layer. The extended portion of the second alternating conductivity type layer below the second peripheral portion of the first electrode layer is biased surely at the reverse bias voltage. Moreover, if dynamic avalanche breakdown is caused in the extended portion of the second alternating conductivity type layer, the carriers caused will be extracted to the first electrode layer via the second well region of the second conductivity type and the semiconductor device is prevented from being broken down.

Advantageously, the innermost second semiconductor region (or the outermost second semiconductor region) of the first alternating conductivity type layer in contact with the outermost fifth semiconductor region (or the innermost fifth semiconductor region) of the third alternating conductivity type layer is connected to the first well region of the second conductivity type. Since the pn-junction between the second semiconductor region of the second conductivity type of the first alternating conductivity type layer and the fifth semiconductor region of the first conductivity type of the third alternating conductivity type layer is connected to the first well region of the second conductivity type, dynamic avalanche breakdown is hardly caused. Moreover, this structure facilitates adjusting the charge balance between the second semiconductor region and the fifth semiconductor region in contact with each other.

Advantageously, the outermost second semiconductor region of the first alternating conductivity type layer in contact with the innermost third semiconductor region of the second alternating conductivity type layer is connected to the second well region of the second conductivity type. Since the pn-junction between the second semiconductor region of the second conductivity type of the first alternating conductivity type layer and the third semiconductor region of the first conductivity type of the second alternating conductivity type layer is connected to the second well region of the second conductivity type, dynamic avalanche breakdown is hardly caused. Moreover, this structure facilitates adjusting the charge balance between the second semiconductor region and the fifth semiconductor region in contact with each other.

BRIEF DESCRIPTION OF THE DRAWINGS

The invention will be described with reference to certain preferred embodiments thereof along with the accompanying drawings, wherein.

DETAILED DESCRIPTION OF THE PREFERRED EMBODIMENTS

In the following descriptions, the n-type layer or the n-type region is a layer or a region, therein electrons are majority carriers. The p-type layer or the p-type region is a layer or a region, therein holes are majority carriers. The suffix "+" on the right shoulder of the letter "n" or "p" indicating the conductivity type of the layer or the region indicates that the region or the layer is doped relatively heavily. The suffix "−" on the right shoulder of the letter "n" or "p" indicating the conductivity type of the layer or the region indicates that the region or the layer is doped relatively lightly.

First Embodiment

Figure 1:
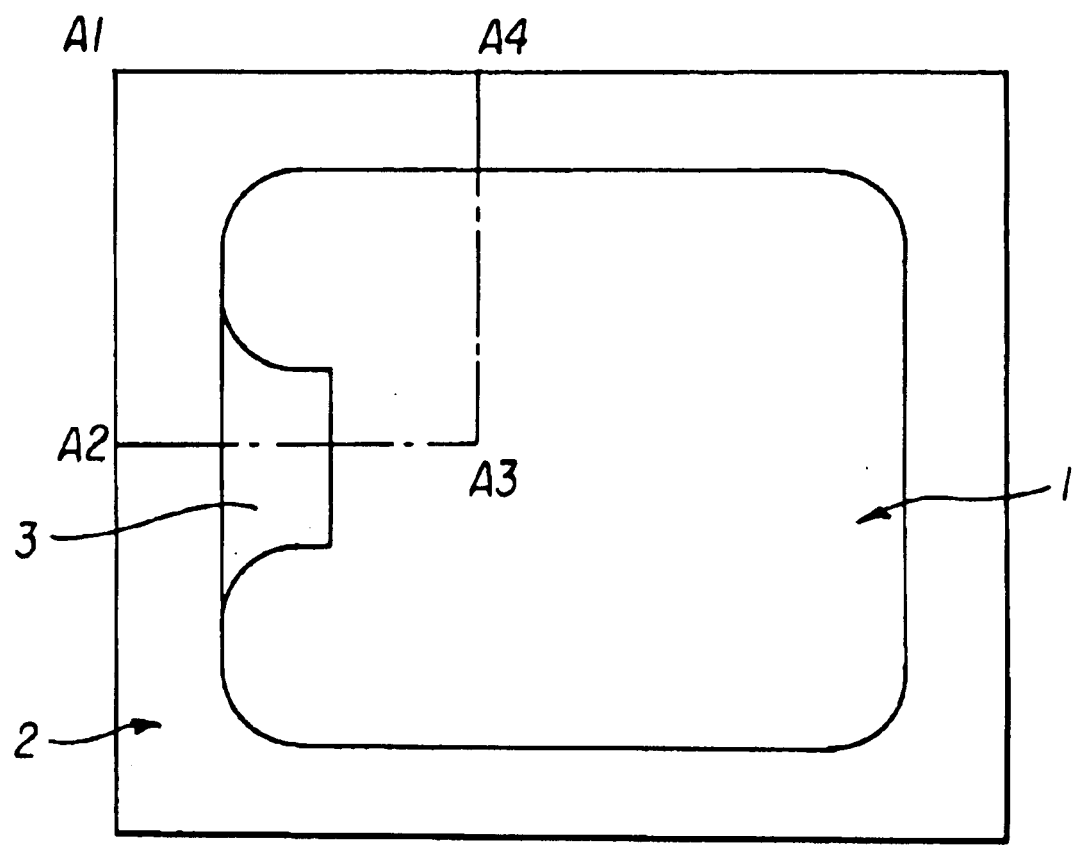
FIG. 1 is a top plan view of the semiconductor chip of a vertical MOSFET according to the first embodiment of the invention.
Figure 2:
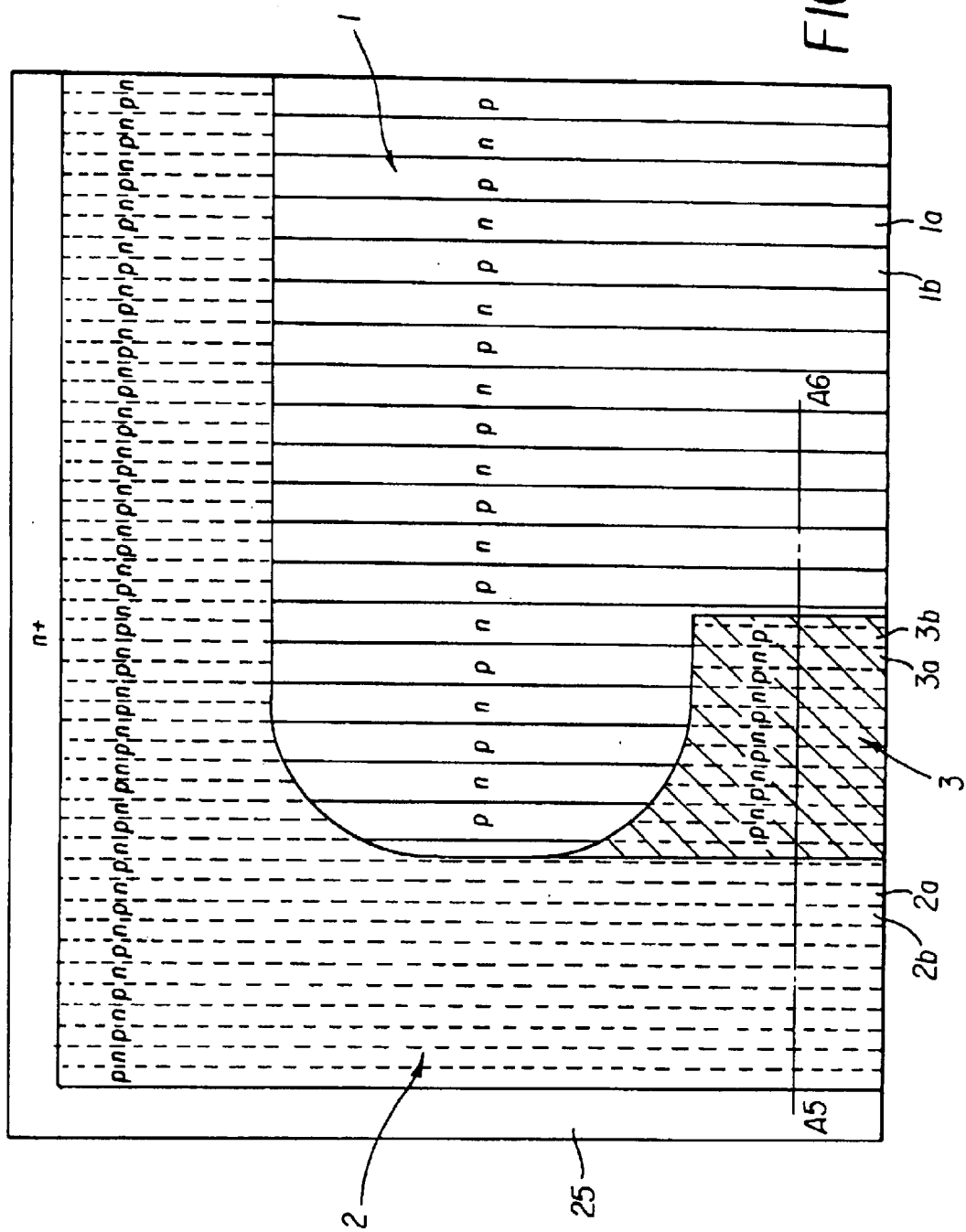
FIG. 2 is an expanded top plan view of the rectangular area defined by the lines A1–A2–A3–A4 in FIG. 1.
Figure 3:
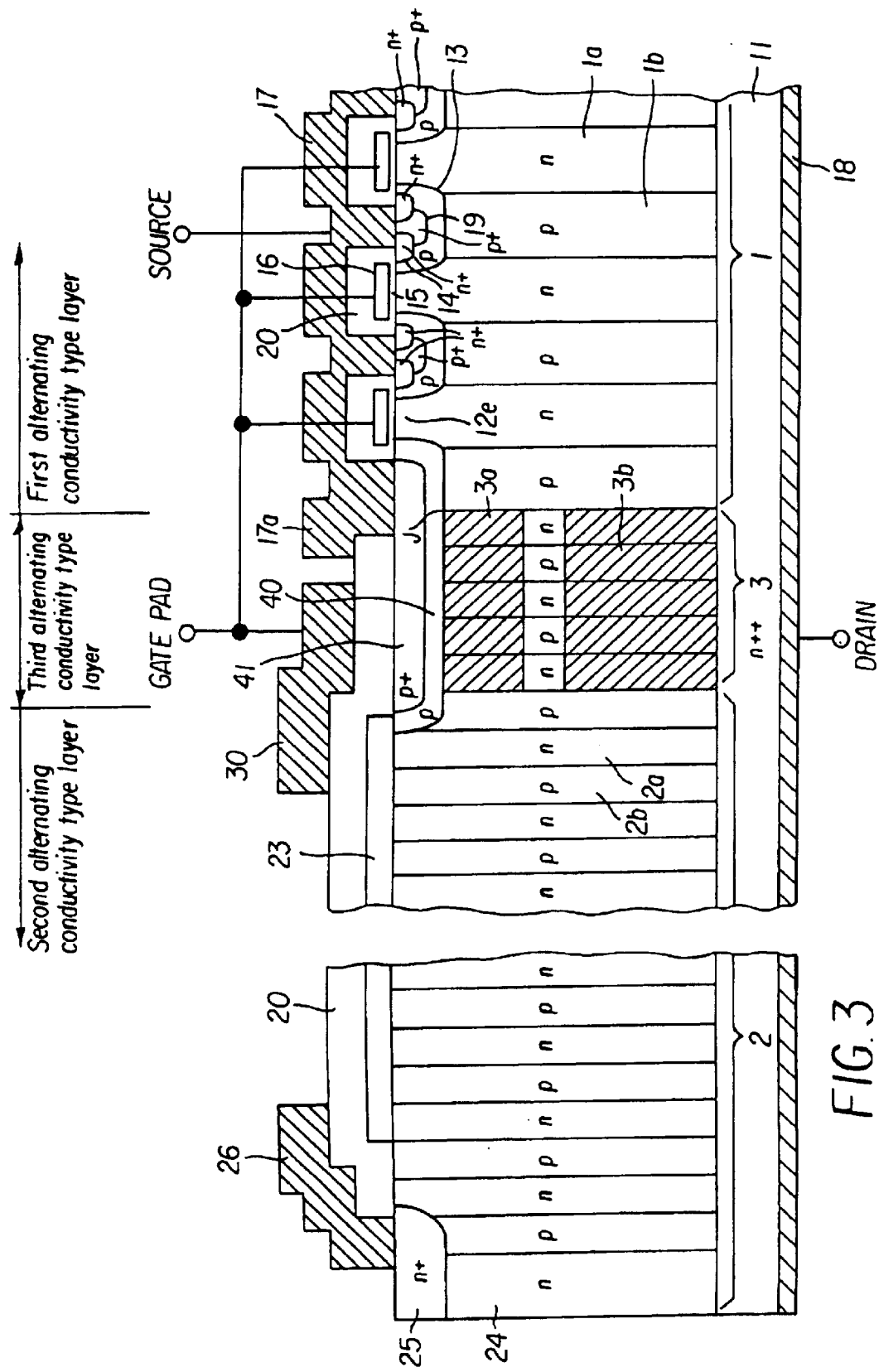
FIG. 3 is a cross section along A5–A6 of FIG. 2.

FIG. 1 is a top plan view of the semiconductor chip of a vertical MOSFET according to a first embodiment of the invention. The surface active region, the source electrode layer and the gate pad on the insulation film are omitted from FIG. 1. FIG. 2 is an expanded top plan view of the rectangular area defined by the lines A1–A2–A3–A4 of FIG. 1. FIG. 3 is a cross section along A5–A6 of FIG. 2.

The vertical MOSFET according to the first embodiment includes a drain electrode 18 on the back surface of a semiconductor chip; an $n^{++}$-type drain layer (drain contact layer) 11 with low electrical resistance in electrical contact with drain electrode 18; a drain drift region 1 including a first alternating conductivity type layer on $n^{++}$-type drain layer 11; heavily doped p-type base regions 13 in the surface portion of drain drift region 1, p-type base regions 13 being cells selectively formed and shaped with respective rings or stripes; a heavily doped $n^+$-type source region 14 formed selectively in the surface portion of p-type base region 13; $p^+$-type contact region 19 formed selectively in the surface portion of p-type base region 13; polycrystalline silicon gate electrode layers 16 above the semiconductor chip with gate insulation films 15 interposed therebetween; an interlayer insulation film 20 covering gate insulation films 15; and a source electrode 17 in electrical contact with $p^+$-type contact regions 19 and $n^+$-type source regions 14 via contact holes bored in interlayer insulation film 20. The p-type base regions 13, each shaped with a well, and $n^+$-type source regions 14 formed in the surface portions of respective p-type base regions 13 constitute a double-diffused MOS region. The surface active region of the MOSFET according to the first embodiment corresponds to p-type base regions 13 and $n^+$-type source regions 14.

Drain drift region 1 is formed by laminating many n-type epitaxially grown layers on $n^{++}$-type drain layer 11 as a substrate. The first alternating conductivity type layer in drain drift region 1 is formed of vertically-extending layer-shaped n-type drift current path regions (hereinafter referred to simply as "drift regions") 1a and vertically-extending layer-shaped p-type partition regions 1b arranged alternately and laminated laterally. In the MOSFET according to the first embodiment, each n-type drift region 1a is positioned between adjacent p-type base regions 13 and 13. The upper portions of n-type drift regions 1a are extended to channel regions 12e in the surface portion of the semiconductor chip. The lower ends of n-type drift regions 1a are in contact with n$^{++}$-type drain layer 11. The upper ends of p-type partition regions 1b are in contact with the bottom portions of the respective p-type base regions 13, each shape with a well, except the side portions of the wells. The lower ends of p-type partition regions 1b are in contact with n$^{++}$-type drain layer 11. For the breakdown voltage of the 600 V class, n-type drift region 1a and p-type partition region 1b are 8$\mu$ in width and around 40$\mu$ in depth. The impurity concentration is 2.5×10$^{15}$ cm$^{-3}$ for n-type drift regions 1a and p-type partition regions 1b. The acceptable impurity concentration is from 1×10$^{15}$ cm$^{-3}$ to 3×10$^{15}$ cm$^{-3}$ for n-type drift regions 1a and p-type partition regions 1b.

As shown in FIG. 1, a breakdown withstanding region (peripheral region) 2 is around drain drift region 1, which occupies the main part of the semiconductor chip, and between the semiconductor chip surface and n$^{++}$-type drain layer 11. Breakdown withstanding region 2 does not provide any current path in the ON-state of the MOSFET and is depleted in the OFF-state of the MOSFET. Breakdown withstanding region 2 includes a second alternating conductivity type layer formed of vertically-extending layer-shaped n-type regions 2a and vertically-extending layer-shaped p-type regions 2b arranged alternately and laminated laterally. The boundaries between n-type drift regions 1a and p-type partition regions 1b of the first alternating conductivity type layer in drain drift region 1 and the boundaries between n-type regions 2a and p-type regions 2b of the second alternating conductivity type layer in breakdown withstanding region 2 extend in parallel to each other. At the boundary between drain drift region 1 and breakdown withstanding region 2, a region of one conductivity type of drain drift region 1 and a region of the opposite conductivity type of breakdown withstanding region 2 are in contact with each other such that pairing of an n-type region and a p-type region is repeated continuously across the boundary.

As shown in FIG. 2, the end faces of n-type drift regions 1a and p-type partition regions 1b of the first alternating conductivity type layer and the end faces of n-type regions 2a and p-type regions 2b of the second alternating conductivity type layer are in contact with each other. In the illustrated embodiment, the second pitch of repeating, at which a pair of n-type region 2a and p-type region 2b is repeated is narrower than the first pitch of repeating, at which a pair of n-type drift region 1a and p-type partition region 1b is repeated. Breakdown withstanding region 2 is doped more lightly than drain drift region 1. The n-type region 2a and p-type region 2b are 4$\mu$ in width and around 40$\mu$ in depth. The impurity concentration is 2.5×10$^{13}$ cm$^{-3}$ for regions 2a and p-type regions 2b. The acceptable impurity concentration is 2×10$^{14}$ cm$^{-3}$ or less for n-type regions 2a and p-type regions 2b. An insulation film 23 such as a thermal oxide film and a phosphate silicate glass (PSG) is formed on breakdown withstanding region 2 for surface protection and for surface stabilization.

A relatively wide n-type channel stopper region 24 is arranged in the outside of breakdown withstanding region 2. The n-type channel stopper region 24 is connected electrically via an n$^{+}$-type contact region 25 to a peripheral electrode 26 biased at the drain voltage.

Drain drift region 1 is rectangular on the chip plane. A gate pad 30 is positioned on one of the sides of rectangular drain drift region 1. Gate pad 30 is on interlayer insulation film 20. Source electrode layer 17 includes a peripheral field plate portion 17a extended around gate pad 30. An under region 3 including a third alternating conductivity type layer is below gate pad 30 and between the first alternating conductivity type layer of drain drift region 1 and the second alternating conductivity type layer of breakdown withstanding region 2. The boundaries between n-type drift regions 1a and p-type partition regions 1b in drain drift region 1 and the boundaries between n-type regions 3a and p-type regions 3b in under region 3 extend in parallel to each other. At the boundary between drain drift region 1 and under region 3, a region of one conductivity type of drain drift region 1 and a region of the opposite conductivity type of under region 3 are in contact with each other such that pairing of an n-type region and a p-type region is repeated continuously across the boundary. The boundaries between n-type regions 2a and p-type regions 2b in breakdown withstanding region 2 and the boundaries between n-type regions 3a and p-type regions 3b in under region 3 extend in parallel to each other. At the boundary between breakdown withstanding region 2 and under region 3, a region of one conductivity type of breakdown withstanding region 2 and a region of the opposite conductivity type of under region 3 are in contact with each other such that pairing of an n-type region and a p-type region is repeated continuously across the boundary.

In the illustrated embodiment, the third pitch of repeating, at which a pair of n-type region 3a and p-type region 3b is repeated is narrower than the first pitch of repeating, at which a pair of n-type drift region 1a and p-type partition region 1b is repeated. The third pitch of repeating is the same with the second pitch of repeating, at which a pair of n-type region 2a and p-type region 2b is repeated. Under region 3 is doped more lightly than drain drift region 1. The impurity concentrations in under region 3 are the same with those in breakdown withstanding region 2. The n-type region 3a and p-type region 3b are 4$\mu$ in width and around 40$\mu$ in depth. The impurity concentration is 2.5×10$^{13}$ cm$^{-3}$ for n-type regions 3a and p-type regions 3b. The acceptable impurity concentration is 2×10$^{14}$ cm$^{-3}$ or less for n-type regions 3a and p-type regions 3b.

A first p-type well region 40 is on the third alternating conductivity type layer in under region 3. The first p-type well region 40 is connected electrically via a p$^{+}$-type contact region 41 to source electrode 17. The n-type regions 3a and p-type regions 3b are in contact with the bottom of the first p-type well region 40 except the side face of the first p-type well region 40. The outermost p-type partition region 1b of drain drift region 1 is in contact with the inner portion of the bottom of the first p-type well region 40. The pn-junction between the outermost p-type partition region 1b of drain drift region 1 and the innermost n-type region 3a of under region 3 is connected to the bottom of the first p-type well region 40. The innermost n-type region 2a of breakdown withstanding region 2 is in contact with the outer portion of the bottom of the first p-type well region 40.

Preferably, n-type regions 1a, 2a and 3a or p-type regions 1b, 2b and 3b of the first, second and third alternating conductivity type layers are formed by connecting vertically a plurality of unit diffusion regions scattered and buried in the thickness direction of the semiconductor chip, since this method facilitates forming the alternating conductivity type layers. The impurity concentration is the maximum at the center of each unit diffusion region and reduces gradually as the position is spaced apart away from the center.

Now the operation of the n-channel MOSFET according to the first embodiment will be explained. When gate electrode layers 16 are biased at a predetermined positive potential, the n-channel MOSFET is brought into the ON-state thereof. Electrons are injected from source regions 14 to channel regions 12e via the inversion layers induced in the surface portions of p-type base regions 13 below gate electrode layers 16. The injected electrons flow to $n^{++}$-type drain layer 11 via n-type drift regions 1a, connecting drain electrode 18 and source electrode 17 electrically.

As the positive potential is removed from gate electrode layers 16, the MOSFET is brought to the OFF-state thereof. The inversion layers induced in the surface portions of p-type base regions 13 vanish, and drain electrode 18 and source electrode 17 are disconnected electrically from each other. When the reverse bias voltage (the voltage between the source and the drain) in the OFF-state is high, p-type base regions 13 and channel regions 12e are depleted by the depletion layers expanding from the pn-junctions between p-type base regions 13 and channel regions 12e. Since p-type partition regions 1b of drain drift region 1 are connected electrically to source electrode 17 via p-type base regions 13 and since n-type drift regions 1a are connected electrically to drain electrode 18 via $n^{++}$-type drain layer 11, drain drift region 1 is depleted quickly by the depletion layer expanding from the pn-junctions between p-type partition regions 1b and n-type drift regions 1a into p-type partition regions 1b and n-type drift regions 1a. Since a high breakdown voltage is secured in drain drift region 1, drain drift region 1 is doped heavily and, therefore, a high current capacity is obtained in drain drift region 1.

As described earlier, the second alternating conductivity type layer is around the first alternating conductivity type layer. Since some p-type regions 2b in the second alternating conductivity type layer are connected electrically to source electrode 17 via p-type base regions 13 or via p-type well region 40 and since n-type regions 2a are connected electrically to drain electrode 18 via $n^{++}$-type drain layer 11, breakdown withstanding region 2 is depleted across the thickness thereof by the depletion layers expanding from the pn-junctions extending across breakdown withstanding region 2. In contrast to the surface guard ring structure or the field plate structure which deplete the surface side of the semiconductor chip, breakdown withstanding region 2 according to the first embodiment of the invention facilitates depleting not only the surface side of the semiconductor chip but also the peripheral portion and the deep portion of the semiconductor chip. Therefore, the electric field strength is relaxed and a high breakdown voltage is obtained in breakdown withstanding region 2. Thus, a super-junction semiconductor device with a high breakdown voltage is obtained.

Since the second pitch of repeating in breakdown withstanding region 2 is narrower than the first pitch of repeating in drain drift region 1, and since breakdown withstanding region 2 is doped more lightly than drain drift region 1, breakdown withstanding region 2 is depleted more quickly than drain drift region 1. Therefore, the breakdown voltage of the MOSFET according to the first embodiment of the invention is very reliable. Since the end faces of n-type regions 2a and p-type regions 2b of breakdown withstanding region 2 are in contact with the end faces of n-type drift regions 1a and p-type partition regions 1b of drain drift region 1, most part of breakdown withstanding region 2 is depleted. Therefore, the breakdown voltage in breakdown withstanding region 2 of the super-junction semiconductor device including drain drift region 1 formed of the first alternating conductivity layer is secured by the second alternating conductivity type layer constituting breakdown withstanding region 2. Thus, breakdown withstanding region 2 formed of the second alternating conductivity layer facilitates optimizing the first alternating conductivity layer in drain drift region 1, widening the range of choice for designing super-junction semiconductor devices, and developing super-junction semiconductor devices.

Since the third pitch of repeating in under region 3 below gate pad 30 is narrower than the first pitch of repeating in drain drift region 1, and since under region 3 is doped more lightly than drain drift region 1, depletion layers expand more easily across a unit area in under region 3 than in drain drift region 1, and the breakdown voltage of the MOSFET according to the first embodiment is not determined by under region 3. When the MOSFET is turned off, depletion layers expand more quickly in under region 3 than in drain drift region 1, the electric field strength in under region 3 is relaxed, and carriers are expelled to drain drift region 1. Therefore, dynamic avalanche breakdown is hardly caused in under region 3, the breakdown voltage of the MOSFET is stabilized, and a high withstanding capability against dynamic avalanche breakdown is obtained.

Since all the p-type regions 3b of the third alternating conductivity type layer are biased surely at a reverse bias voltage due to the provision of the first p-type well region 40 electrically connected to source electrode 17 on the third alternating conductivity type layer, depletion layers expand easily from the pn-junction between p-type regions 3b and n-type regions 3a to the depth direction of the semiconductor chip, the breakdown voltage is high in under region 3, and dynamic avalanche breakdown is caused more hardly in under region 3. Therefore, the withstanding capability against dynamic avalanche breakdown is improved. If dynamic avalanche breakdown is caused in under region 3, the excessive holes caused will be extracted to source electrode 17 via the first p-type region 40. Therefore, the MOSFET is not broken down by the heat generated and such causes.

Since the third alternating conductivity type layer of under region 3 is in contact with the bottom of the first p-type well region 40, the third alternating conductivity type layer of under region 3 is depleted uniformly. The outermost p-type partition region 1b is in contact with the inner bottom portion of the first p-type well region 40, and the pn-junction J between the outermost p-type partition region 1b and the innermost n-type region 3a of under region 3 adjacent to the outermost p-type partition region 1b is in contact with the bottom of the first p-type well region 40. Although the electric field tends to localize to the inner side of the first p-type well region 40 and dynamic avalanche breakdown tends to be caused due to the arrangement described above, it is possible to confine the dynamic avalanche breakdown within drain drift region 1 and to adjust the charge balance between innermost n-type region 3a and the adjacent outermost p-type partition region 1b.

Figure 4:
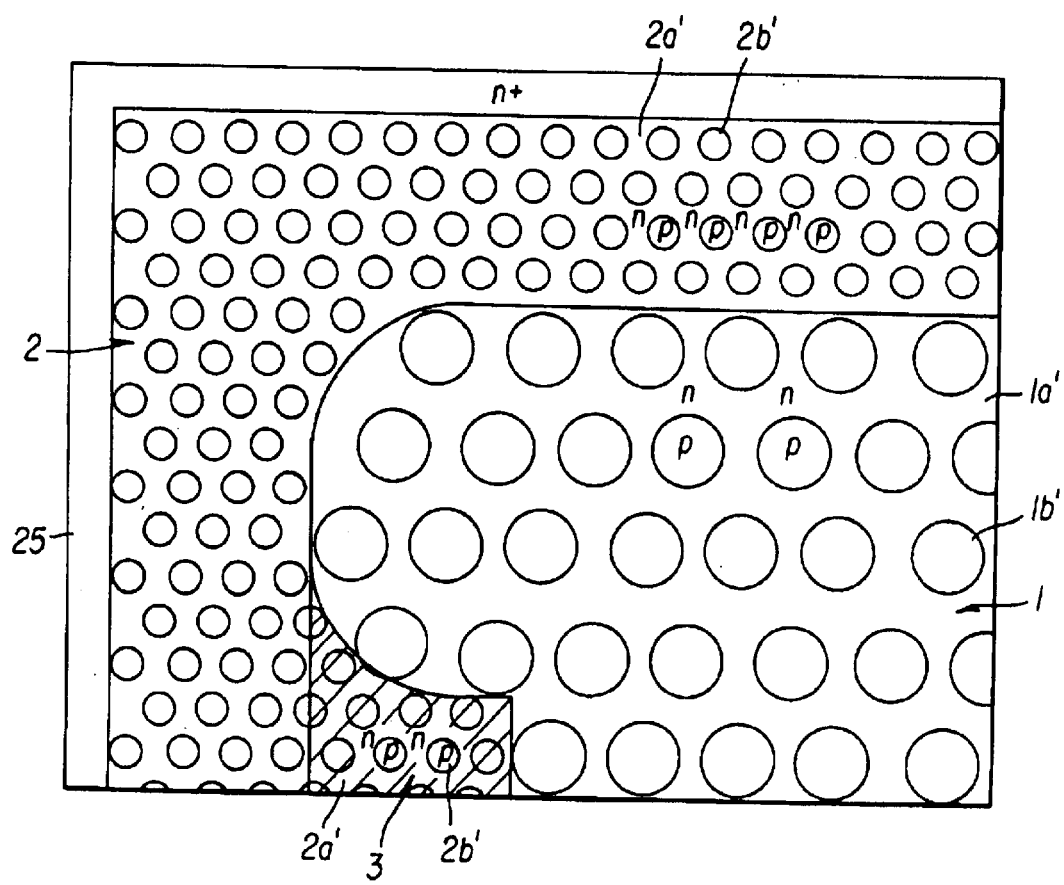
FIG. 4 is another top plan view of the semiconductor chip of another vertical MOSFET according to the first embodiment showing a modified arrangement of the constituent regions in the alternating conductivity type layer.

In the above described MOSFET according to the first embodiment, n-type regions 1a through 3a and p-type regions 1b through 3b of the first through third alternating conductivity type layers 1 through 3 are shaped with respective stripes extending laterally. Alternatively, p-type regions 1b' through 3b' may be positioned at the lattice points of respective planar lattices and surrounded respectively by n-type regions 1a' through 3a' as shown in FIG. 4. In this arrangement, p-type regions 1b' through 3b' are columns extending in the thickness direction of the semiconductor chip. The p-type regions 1b' through 3b' or n-type regions 1a' through 3a' are formed by connecting vertically a plurality of unit diffusion regions scattered and buried in the thickness direction of the semiconductor chip. The impurity concentration is the maximum at the center of each unit diffusion region and reduces gradually as the position is spaced apart away from the center. Still alternatively, n-type regions may be positioned at the lattice points of a planar lattice scattered in a p-type region.

The breakdown voltage class is changed simply by changing the thickness of the alternating conductivity type layer considering on the designed breakdown voltage class. For example, the preferable thickness of the alternating conductivity type layer is 60 m for the breakdown voltage class of 900 V. In the above described MOSFET according to the first embodiment, the second and third alternating conductivity type layers are doped more lightly than the first alternating conductivity type layer, and the second and third pitches of repeating in the second and third alternating conductivity type layers are narrower than the first pitch of repeating in the first alternating conductivity type layer. Alternatively, the first through third pitches of repeating may be set at the same value, and the second and third alternating conductivity type layers may be doped furthermore lightly. Preferably, the impurity concentrations in the second and third alternating conductivity type layers are from one fifth to one hundredth times as high as the impurity concentration in the first alternating conductivity type layer.

Second Embodiment

Figure 5:
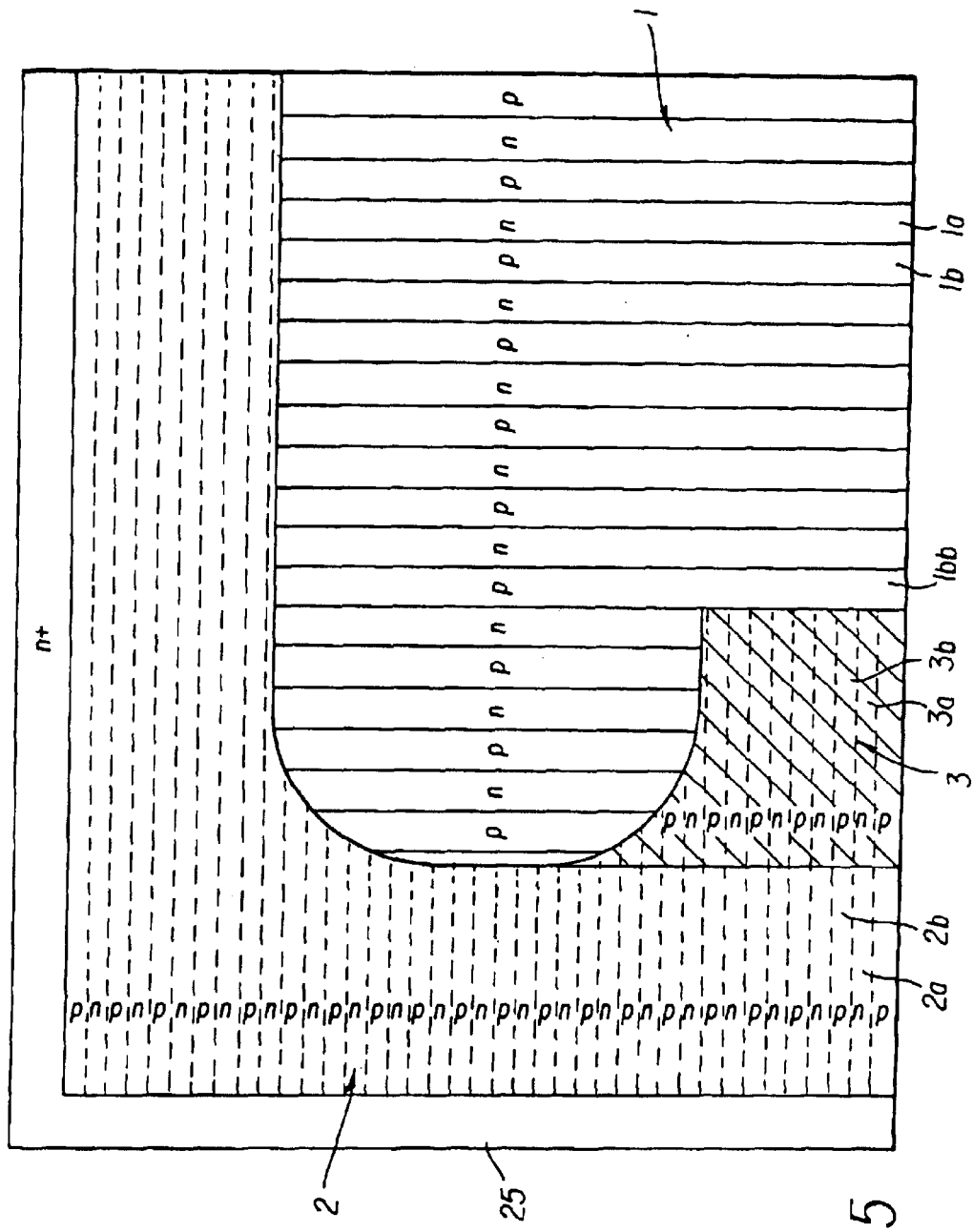
FIG. 5 is an expanded top plan view showing the upper left area of a vertical MOSFET according to the second embodiment of the invention.

FIG. 5 is an expanded top plan view showing the upper left area of a vertical MOSFET according to a second embodiment of the invention. The area shown in FIG. 5 corresponds to the rectangular area as shown in FIG. 2 and as defined by the lines A1–A2–A3–A4 in FIG. 1.

The MOSFET according to the second embodiment includes a drain drift region 1 including a first alternating conductivity type layer, a breakdown withstanding region 2 including a second alternating conductivity type layer and an under region 3 including a third alternating conductivity type layer. The MOSFET according to the second embodiment is different from the MOSFET according to the first embodiment in that the boundaries between the n-type regions and the p-type regions in the second and third alternating conductivity type layers are extending in perpendicular to the boundaries between the n-type drift regions and p-type partition regions in the first alternating conductivity type layer. The n-type drift regions 1a and p-type partition regions 1b in drain drift region 1 are extending in perpendicular to n-type regions 3a and p-type regions 3b in under region 3 in the lateral direction of the semiconductor chip of the MOSFET according to the second embodiment. The n-type drift regions 1a and p-type partition regions 1b in drain drift region 1 are extending in perpendicular to n-type regions 2a and p-type regions 2b in breakdown withstanding region 2. The second and third pitches of repeating, at which a pair of n-type region 2a and p-type region 2b and a pair of n-type region 3a and p-type region 3b are repeated, are narrower than the first pitch of repeating, at which a pair of n-type drift region 1a and p-type partition region 1b is repeated. The second and third pitches of repeating are about half the first pitch of repeating. Moreover, breakdown withstanding region 2 and under region 3 are doped more lightly than drain drift region 1. In FIG. 5, the end faces of some n-type regions 3a and p-type regions 3b in under region 3 are in contact with a p-type partition region 1bb of drain drift region 1. If one considers the curvature of the boundary between drain drift region 1 and under region 3, the pn-junctions thereof are extending in perpendicular to the pn-junctions in drain drift region 1, all the p-type regions 3b in under region 3 will be biased at the source potential even when any p-type well region 40 is not disposed. It is not always necessary to set the third pitch of repeating, at which a pair of n-type region 3a and p-type region 3b is repeated, at a value narrower than the first pitch of repeating.

The MOSFET according to the second embodiment, which includes the first through third alternating conductivity type layer as described above, exhibits the effects same with the effects of the MOSFET according to the first embodiment.

Third Embodiment

Figure 6:
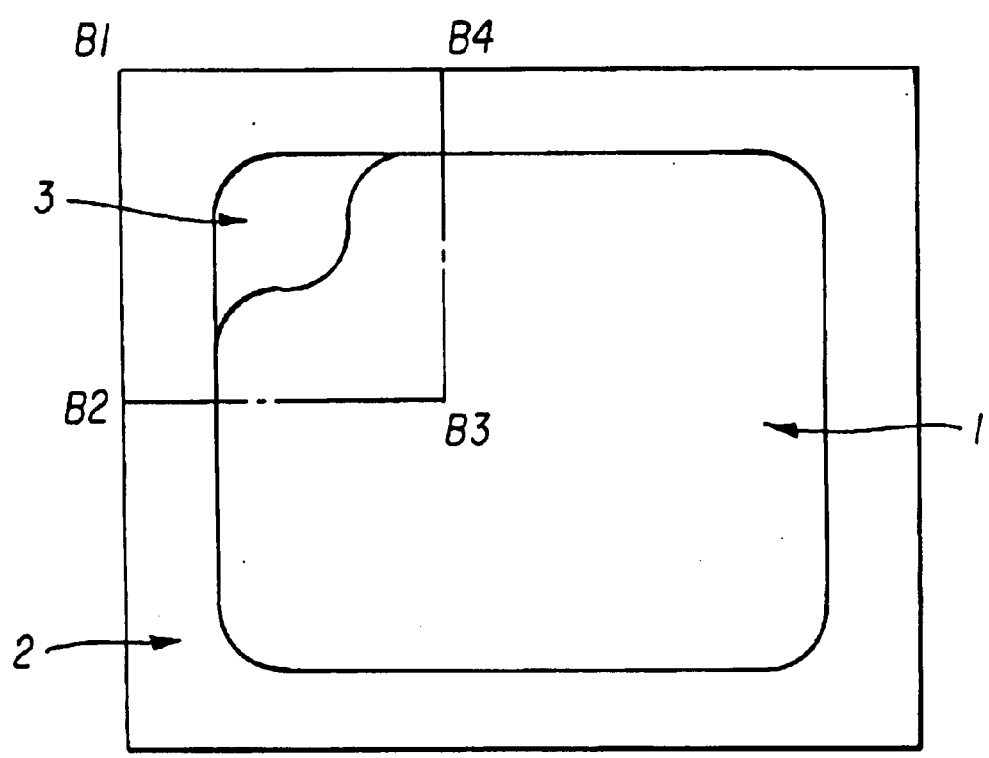
FIG. 6 is a top plan view of the semiconductor chip of a vertical MOSFET according to the third embodiment of the invention.
Figure 7:
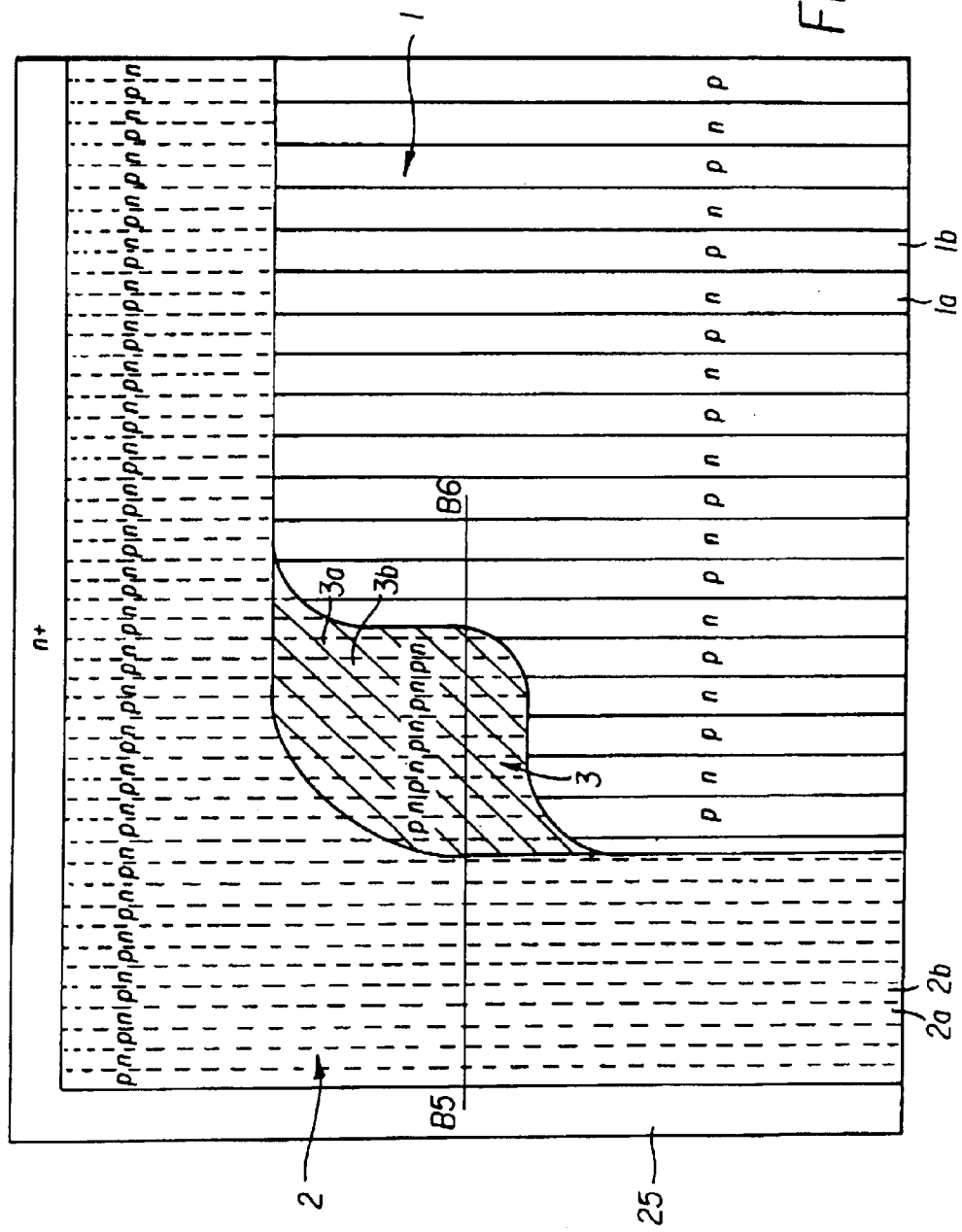
FIG. 7 is an expanded top plan view of the rectangular area defined by the lines B1–B2–B3–B4 of FIG. 6.

FIG. 6 is a top plan view of the semiconductor chip of a vertical MOSFET according to a third embodiment of the invention. The surface active region, the source electrode layer and the gate pad on the insulation film are omitted from FIG. 6. FIG. 7 is an expanded top plan view of the rectangular area defined by the lines B1–B2–B3–B4 of FIG. 6. The cross section along B5–B6 of FIG. 7 is the same with FIG. 3.

The MOSFET according to the third embodiment includes a drain drift region 1 including a first alternating conductivity type layer, a breakdown withstanding region 2 including a second alternating conductivity type layer, and an under region 3 including a third alternating conductivity type layer below a gate pad. Under region 3 is positioned at a corner of drain drift region 1. The pn-junctions in drain drift region 1 and the pn-junctions in under region 3 are extending in parallel to each other laterally. The pn-junctions in drain drift region 1 and the pn-junctions in breakdown withstanding region 2 are extending in parallel to each other laterally. The second and third pitches of repeating, at which a pair of n-type region 2a and p-type region 2b and a pair of n-type region 3a and p-type region 3b are repeated, are narrower than the first pitch of repeating, at which a pair of n-type drift region 1a and p-type partition region 1b is repeated. The second and third pitches of repeating are about half the first pitch of repeating. Moreover, breakdown withstanding region 2 and under region 3 are doped more lightly than drain drift region 1. Since the third pitch of repeating is narrower than the first pitch of repeating, under region 3 is deleted surely, even when any p-type well region 40 is not disposed.

The MOSFET according to the third embodiment, which includes under region 3 at a corner of drain drift region 1, exhibits the effects same with the effects of the MOSFET according to the first embodiment.

Fourth Embodiment

Figure 8:
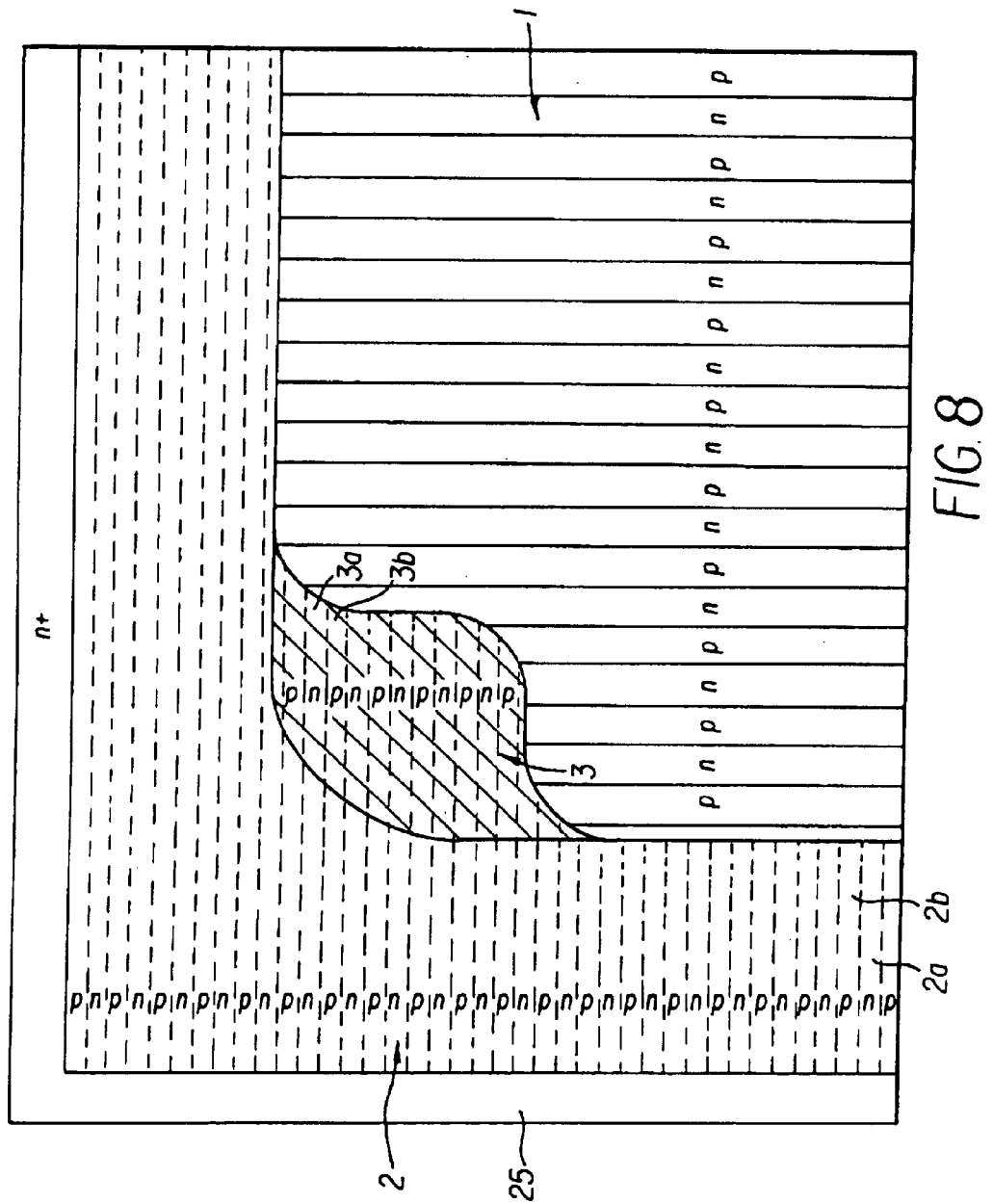
FIG. 8 is an expanded top plan view showing the upper left area of a vertical MOSFET according to the fourth embodiment of the invention.

FIG. 8 is an expanded top plan view showing the upper left area of a vertical MOSFET according to a fourth embodiment of the invention. FIG. 8 corresponds to the expanded top plan view of the rectangular area defined by the lines B1–B2–B3–B4 of FIG. 6.

In the same manner as the MOSFET according to the third embodiment, the MOSFET according to the fourth embodiment includes a drain drift region 1 including a first alternating conductivity type layer, a breakdown withstanding region 2 including a second alternating conductivity type layer, and an under region 3 including a third alternating conductivity type layer below a gate pad. Under region 3 is positioned at a corner of drain drift region 1. The pn-junctions in drain drift region 1 and the pn-junctions in under region 3 are extending in perpendicular to each other laterally. The pn-junctions in drain drift region 1 and the pn-junctions in breakdown withstanding region 2 are extending in perpendicular to each other laterally. The second and third pitches of repeating, at which a pair of n-type region 2a and p-type region 2b and a pair of n-type region 3a and p-type region 3b are repeated, are narrower than the first pitch of repeating, at which a pair of n-type drift region 1a and p-type partition region 1b is repeated. The second and third pitches of repeating are about half the first pitch of repeating. Moreover, breakdown withstanding region 2 and under region 3 are doped more lightly than drain drift region 1.

The MOSFET according to the fourth embodiment, which includes under region 3 at a corner of drain drift region 1, exhibits the effects same with the effects of the MOSFET according to the first embodiment. Since drain drift region 1 and under region 3 are in contact with each other across a boundary curved to avoid electric field localization in the corner portion as much as possible, it is difficult to connect the end faces of p-type regions 3a and p-type regions 3b of under region 3 to one of p-type partition regions 1b of drain drift region 1. Although it depends on the curvature of the boundary between under region 3 and drain drift region 1, it becomes possible to bias all the p-type regions 3b in under region 3 at the source potential by setting the third pitch of repeating, at which a pair of n-type regions 3a and p-type region 3b is repeated, at a value wider than the first pitch of repeating, at which a pair of n-type drift regions 1a and p-type region 1b is repeated, even when any p-type well region 40 is not disposed.

Fifth Embodiment

Figure 9:
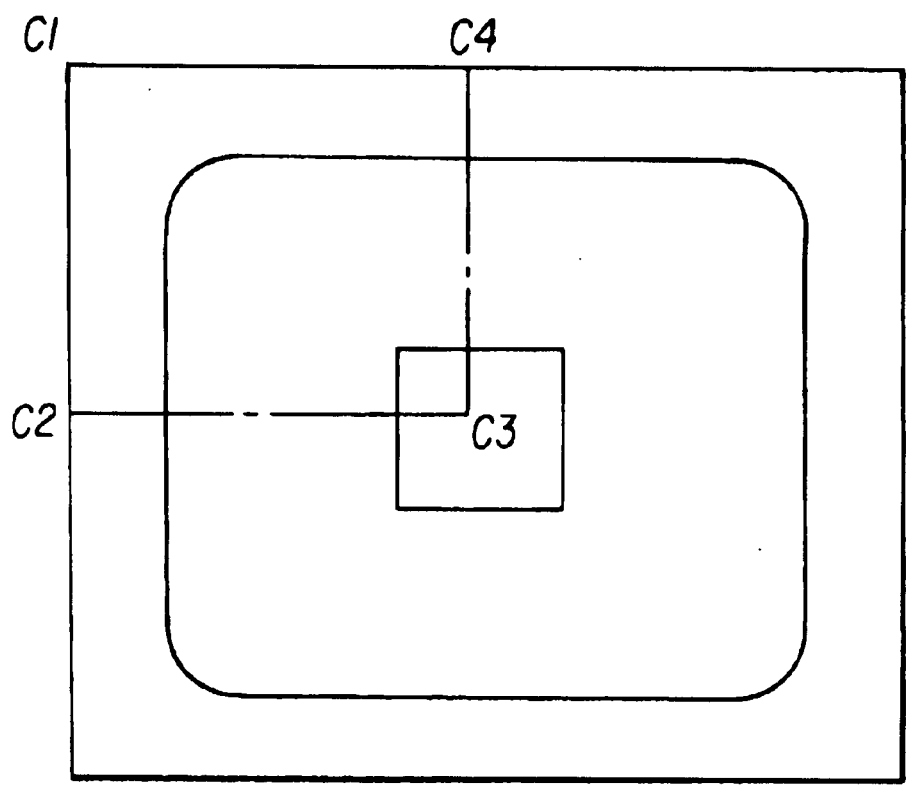
FIG. 9 is a top plan view of the semiconductor chip of a vertical MOSFET according to the fifth embodiment of the invention.
Figure 10:
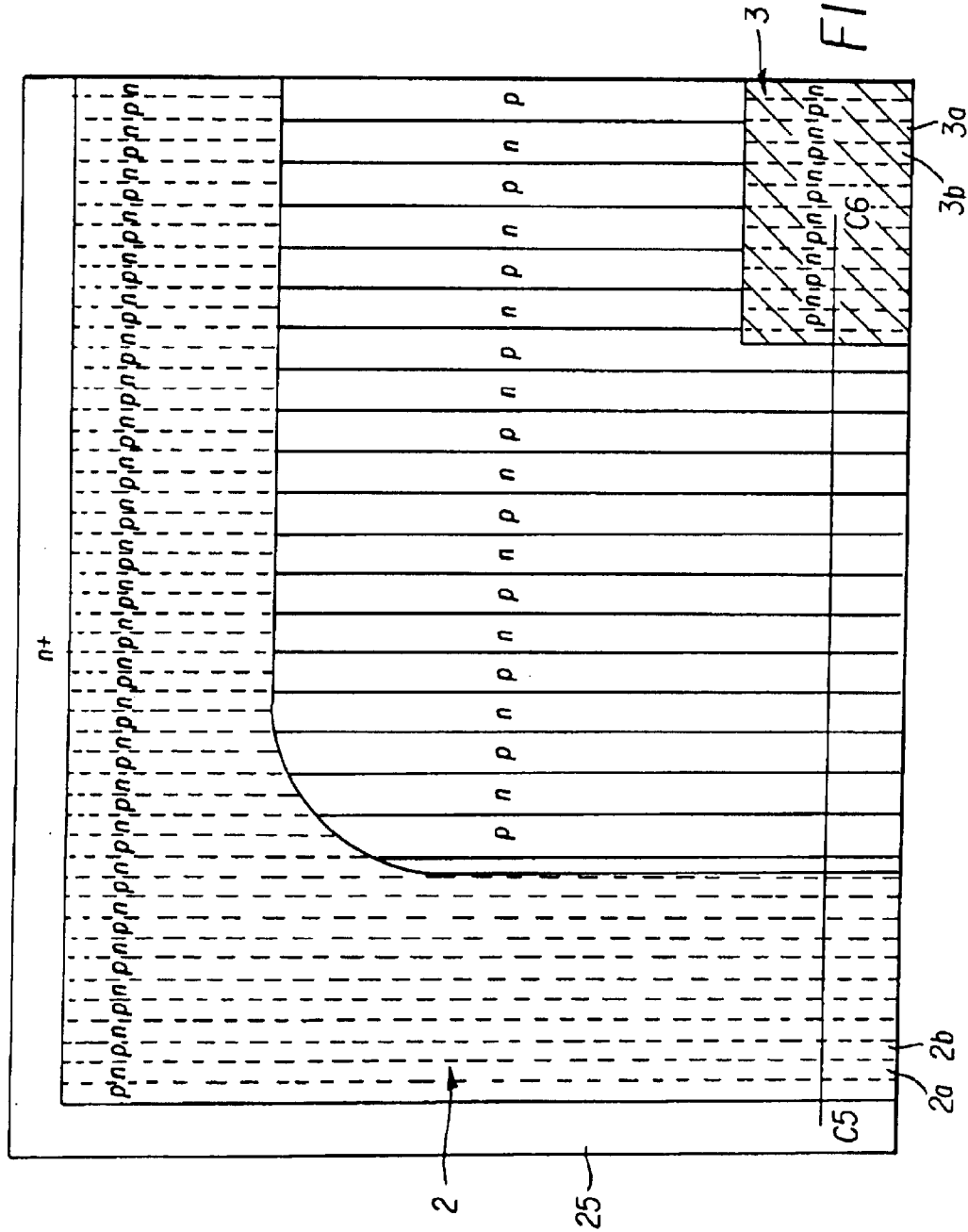
FIG. 10 is an expanded top plan view of the area defined by the lines C1–C2–C3–C4 of FIG. 9.
Figure 11:
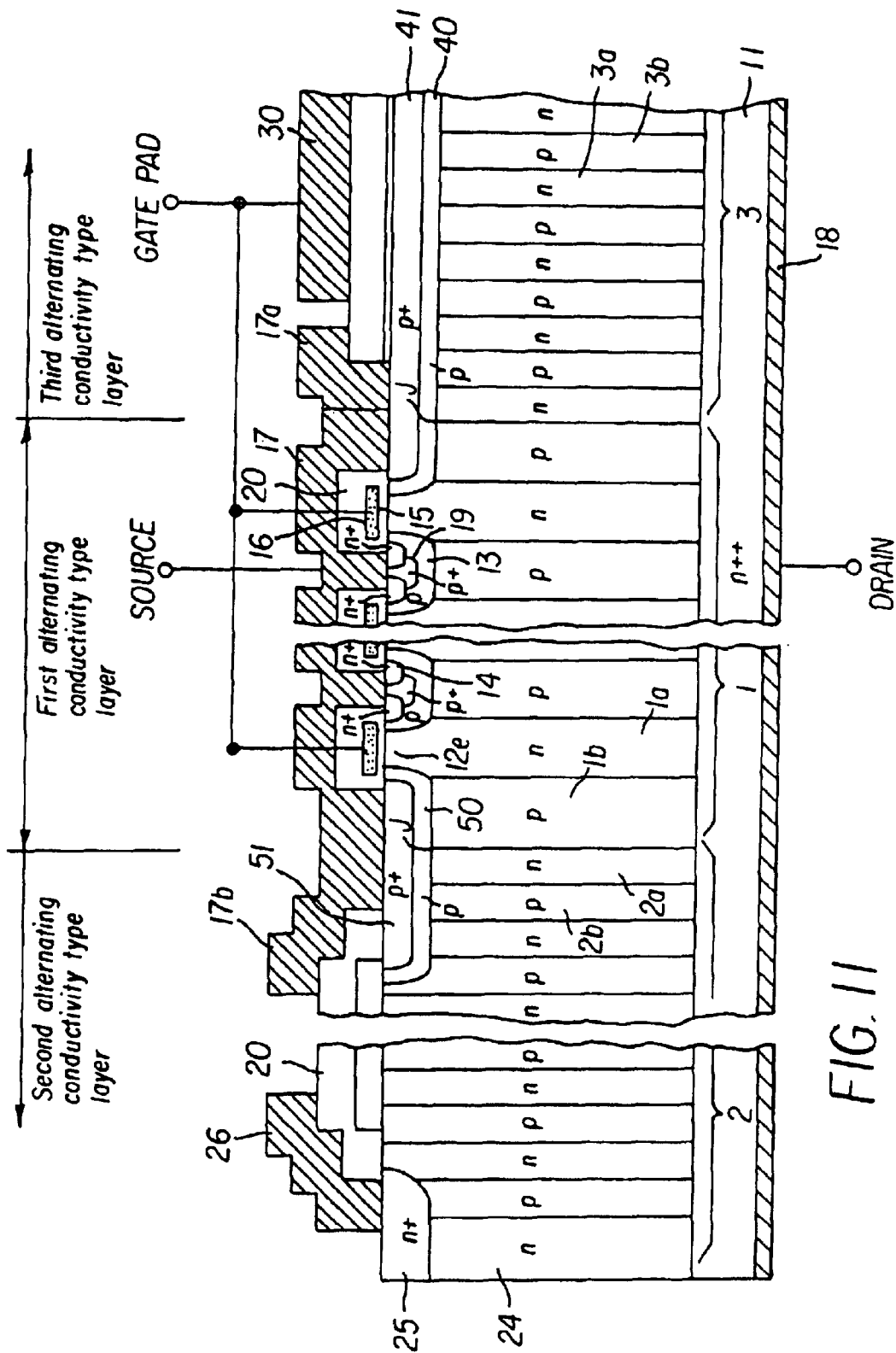
FIG. 11 is a cross section along C5–C6 of FIG. 10.

FIG. 9 is a top plan view of the semiconductor chip of a vertical MOSFET according to a fifth embodiment of the invention. The surface active region, the source electrode layer and the gate pad on the insulation film are omitted from FIG. 9. FIG. 10 is an expanded top plan view of the area defined by the lines C1–C2–C3–C4 of FIG. 9. FIG. 11 is a cross section along C5–C6 of FIG. 10.

The MOSFET according to the fifth embodiment includes a drain drift region 1 including a first alternating conductivity type layer, a breakdown withstanding region 2 including a second alternating conductivity type layer and an under region 3 including a third alternating conductivity type layer under a gate pad 30. Under region 3 is in the central portion of drain drift region 1. The pn-junctions in drain drift region 1 and the pn-junctions in under region 3 are extending in parallel to each other laterally. The pn-junctions in drain drift region 1 and the pn-junctions in breakdown withstanding region 2 are extending in parallel to each other laterally. The second and third pitches of repeating, at which a pair of n-type region 2a and p-type region 2b and a pair of n-type region 3a and p-type region 3b are repeated, are narrower than the first pitch of repeating, at which a pair of n-type drift region 1a and p-type partition region 1b is repeated. The second and third pitches of repeating are about half the first pitch of repeating. Moreover, breakdown withstanding region 2 and under region 3 are doped more lightly than drain drift region 1. Since the third pitch of repeating is narrower than the first pitch of repeating, all the p-type regions 3b in under region 3 are in contact with p-type partition regions 1b in the depth direction of the semiconductor chip. Therefore, the potential of p-type regions 3b is not floating, and under region 3 is deleted surely, even when any p-type well region 40 is not disposed.

The MOSFET according to the fifth embodiment includes a source electrode 17 including a first peripheral portion 17a and a second peripheral plate portion 17b. A gate pad 30 is positioned in the area surrounded by the first field plate portion 17a. The third alternating conductivity type layer in under region 3 is covered by a first p-type well region 40. The portion of the second alternating conductivity type layer below the second field plate portion 17b is covered by a second p-type well region 50. A p+-type contact region 51 in electrical contact with source electrode 17 is formed in the second p-type well region 50. This configuration facilitates accelerating depletion of the portion of the semiconductor chip below the second field plate portion 17b and obtaining a high withstanding capability against dynamic avalanche breakdown. Since the outermost p-type partition region 1b of the first alternating conductivity type layer is in contact with the bottom of the second p-type well region 50, the charge balance between the innermost n-type region 2a of the second alternating conductivity type layer and the outermost p-type partition region 1b of the first alternating conductivity type layer is adjusted.

Sixth Embodiment

Figure 12:
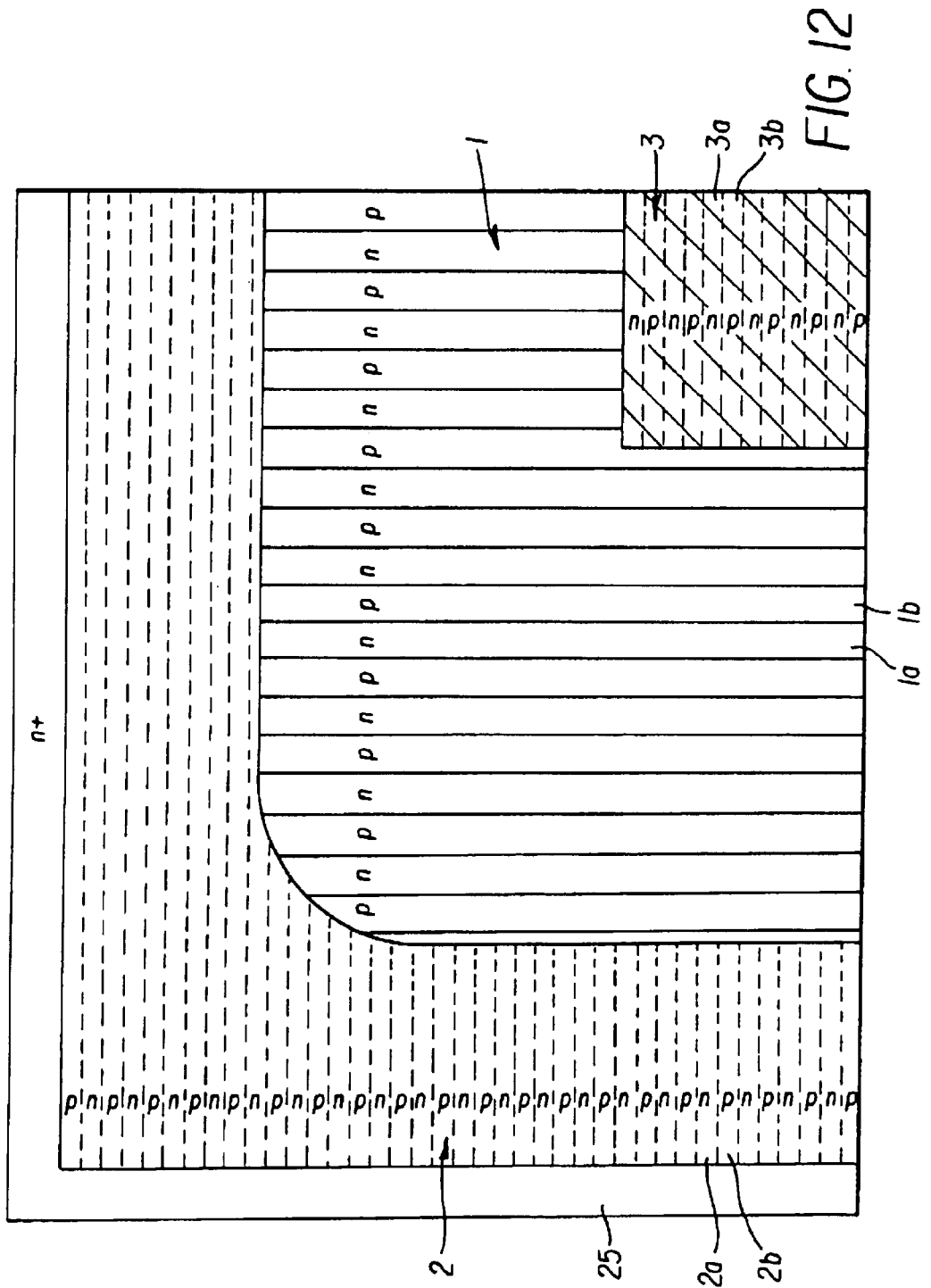
FIG. 12 is an expanded top plan view showing the upper left area of a vertical MOSFET according to the sixth embodiment of the invention.
Figure 13:
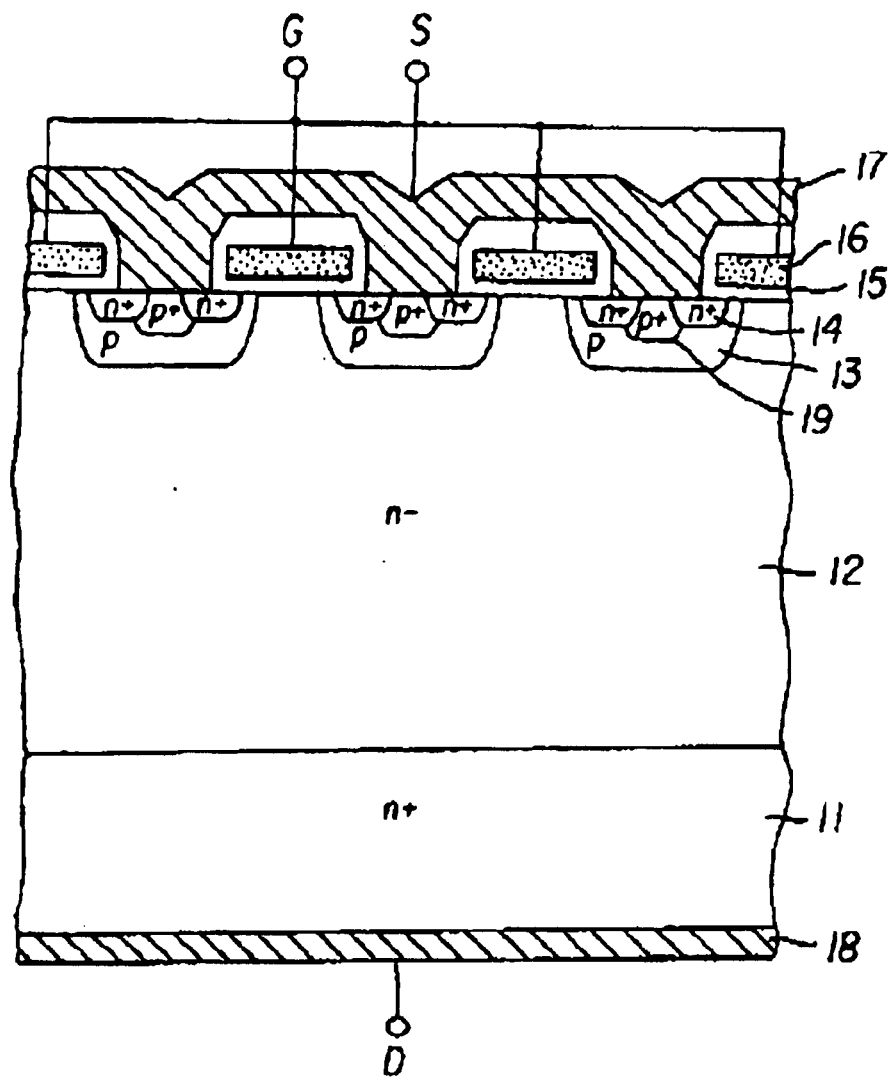
FIG. 13 is a cross sectional view of a conventional planar-type n-channel vertical MOSFET.
Figure 14:
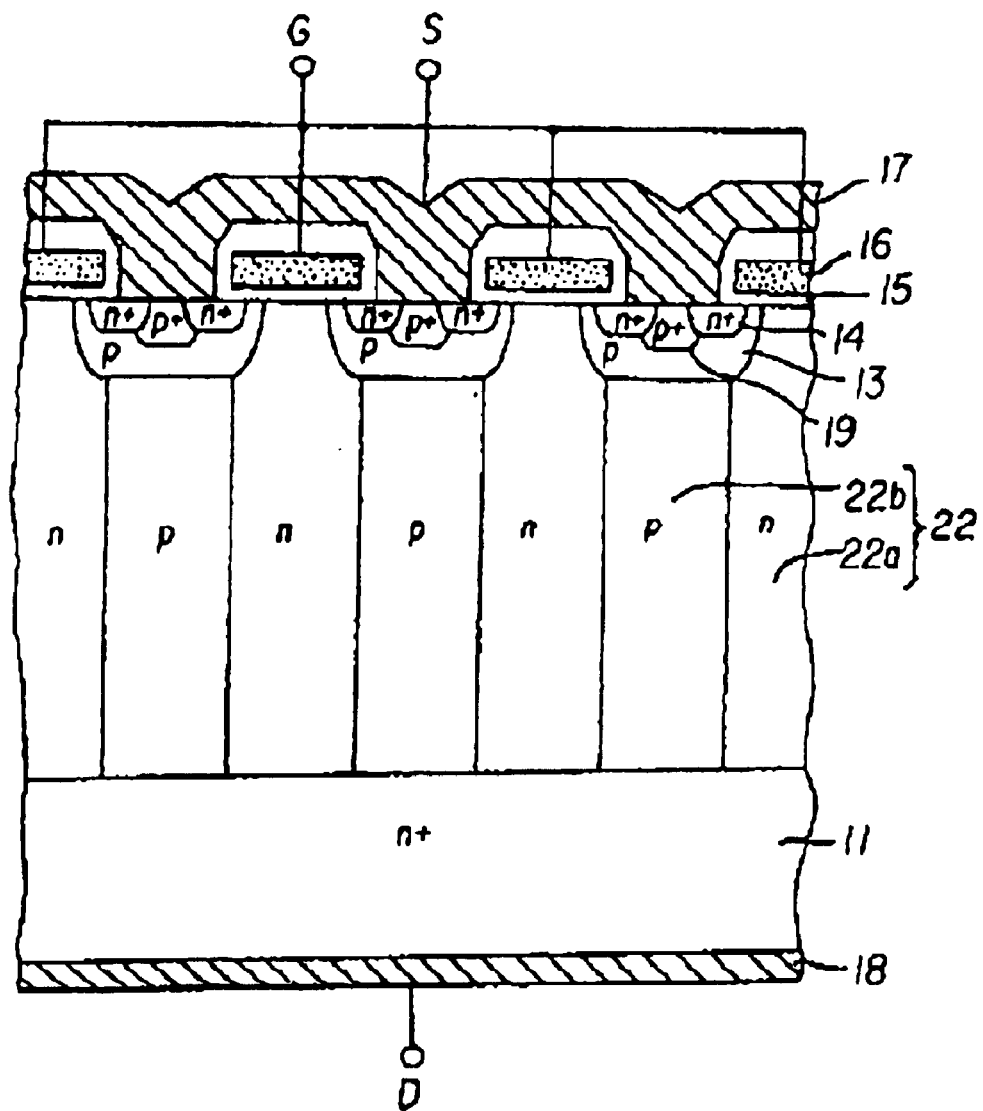
FIG. 14 is a cross sectional view of the vertical MOSFET disclosed in U.S. Pat. No. 5,216,275.

FIG. 12 is an expanded top plan view showing the upper left area of a vertical MOSFET according to a sixth embodiment of the invention. The area shown in FIG. 12 corresponds to the rectangular area as shown in FIG. 10 and as defined by the lines C1–C2–C3–C4 in FIG. 9.

The MOSFET according to the sixth embodiment includes a drain drift region 1 including a first alternating conductivity type layer, a breakdown withstanding region 2 including a second alternating conductivity type layer and an under region 3 including a third alternating conductivity type layer under a gate pad 30. Under region 3 is in the central portion of drain drift region 1. The pn-junctions in drain drift region 1 and the pn-junctions in under region 3 are extending in perpendicular to each other laterally. The pn-junctions in drain drift region 1 and the pn-junctions in breakdown withstanding region 2 are extending in perpendicular to each other laterally. The second and third pitches of repeating, at which a pair of n-type region 2a and p-type region 2b and a pair of n-type region 3a and p-type region 3b are repeated, are narrower than the first pitch of repeating, at which a pair of n-type drift region 1a and p-type partition region 1b is repeated. The second and third pitches of repeating are about half the first pitch of repeating. Moreover, breakdown withstanding region 2 and under region 3 are doped more lightly than drain drift region 1.

Since the end faces of n-type regions 3a and p-type regions 3b are in contact with one p-type partition regions 1b, all the p-type regions in under region 3 are biased at the source potential, even when any p-type well region 40 is not disposed. The MOSFET's according to the fifth and sixth embodiments, which include under region 3 at the central portion of drain drift region 1, exhibits the effects same with the effects of the MOSFET according to the third embodiment, which includes under region 3 at a corner of drain drift region 1.

Although the invention has been explained in connection with double-diffused vertical MOSFET's, the invention is applicable not only to other vertical active semiconductor devices having three terminals such as IGBT's (MOSFET's of conductivity modulation type) and bipolar transistors but also to passive semiconductor devices having two terminals.

As described above, the MOSFET according to the invention includes a semiconductor chip having a first major surface and a second major surface, a first electrode layer on the first major surface, a second electrode layer on the second major surface, a third electrode layer above the first major surface, a drain drift region including a first alternating conductivity type layer, a breakdown withstanding region around the drain drift region including a second alternating conductivity type layer, and an under region below the third electrode layer including a third alternating conductivity type layer extended below the peripheral portion of the first electrode layer. The third pitch of repeating, at which a pair of n-type region and p-type region is repeated in the under region, is narrower than the first pitch of repeating, at which a pair of n-type drift region and p-type partition region is repeated in the drain drift region. Or, the under region is doped more lightly than the drain drift region. The MOSFET according to the invention exhibits the following effects.

Since depletion layers expand from many pn-junction planes due to the second alternating conductivity type layer with a second repeating pitch which is narrower than a first repeating pitch arranged around the drain drift region, the portion of the semiconductor chip in the vicinity of the drain drift region, the portion of the semiconductor chip far from the drain drift region and the portion of the semiconductor chip on the side of the second major surface are depleted. Therefore, the breakdown voltage is higher in the breakdown withstanding region than in the drain drift region. Since a high breakdown voltage is obtained in the breakdown withstanding region of the super-junction MOSFET including an alternating conductivity type layer in the drain drift region thereof, the alternating conductivity type layer in the drain drift region is optimized easily, a super-junction MOSFET is designed more freely, and the resulting MOSFET is a practical one. When the second alternating conductivity type layer in breakdown withstanding region is doped more lightly than the first alternating conductivity type layer in the drain drift region or the breakdown voltage in the breakdown withstanding is surely set at a value higher than the breakdown voltage in the drain drift region, and the reliability of the super-junction semiconductor device is improved.

Since the third pitch of repeating in the third alternating conductivity type layer below the third electrode layer and extended below the peripheral portion of the first electrode layer is narrower than the first pitch of repeating, the unit area in the under region is depleted more easily than the unit area in the drain drift region. Therefore, the breakdown voltage of the semiconductor device is not determined by the under region. Since the under region is depleted more quickly than the drain drift region when the semiconductor device is turned off, since the electric field is relaxed more in the under region than in the drain drift region, and since the carriers are expelled to the drain drift region, dynamic avalanche breakdown is hardly caused in the under region. Since dynamic avalanche breakdown is caused in the drain drift region, dynamic avalanche breakdown is prevented from causing in the under region. Therefore, a stable breakdown voltage and a high withstanding capability against dynamic avalanche breakdown are obtained. The same effects are obtained when the under region is doped more lightly than the drain drift region.

In the structure which includes a p-type well region, electrically connected to the first electrode layer and covering the under layer on the side of the first-major-surface, all the p-type regions in the third alternating conductivity type layer are biased surely at the reverse bias potential in the OFF-state of the semiconductor device. This scheme facilitates expanding depletion layers in the thickness direction of the semiconductor chip from the pn-junctions in the third alternating conductivity type layer. Therefore, the breakdown voltage is high in the under region below the third electrode layer, and the high breakdown voltage makes it more difficult for dynamic avalanche breakdown to be caused in the under region, resulting in a high withstanding capability against dynamic avalanche breakdown. If dynamic avalanche breakdown is caused in the under region below the third electrode layer, carriers will be extracted to the first electrode layer via the p-type well disposed for carrier extraction and, therefore, the semiconductor device will not be destroyed by heat and such causes.

What is claimed is:
1. A semiconductor device comprising:
   a semiconductor chip having a first major surface and a second major surface facing opposite to the first major surface;
   a first electrode layer on the first major surface having a first peripheral portion;
   a second electrode layer on the second major surface;
   an active region in a vicinity of the first major surface, the active region being in electrical contact with the first electrode layer;
   a layer with low electrical resistance of a first conductivity type in a vicinity of the second major surface, the layer with low electrical resistance being in electrical contact with the second electrode layer;
   a drain drift region between the first major surface and the layer with low electrical resistance, the drain drift region providing a vertical drift current path in the ON-state of the semiconductor device, the drain drift region being depleted in the OFF-state of the semiconductor device, wherein the drain drift region comprises a first alternating conductivity type layer comprising vertically extending first semiconductor regions of the first conductivity type and vertically extending second semiconductor regions of a second conductivity type arranged alternately at a first pitch of repeating;
   a breakdown withstanding region around the drain drift region, the breakdown withstanding region being between the first major surface and the layer with low electrical resistance, the breakdown withstanding region providing substantially no current path in the ON-state of the semiconductor device, the breakdown withstanding region being depleted in the OFF-state of the semiconductor device, the breakdown withstanding region comprising a second alternating conductivity type layer comprising vertically extending third semiconductor regions of the first conductivity type and vertically extending fourth semiconductor regions of the second conductivity type arranged alternately at a second pitch of repeating;
   an under region below the first peripheral portion of the first electrode layer, the under region comprising a third alternating conductivity type layer comprising vertically extending fifth semiconductor regions of the first conductivity type and vertically extending sixth semiconductor regions of the second conductivity type arranged alternately at a third pitch of repeating; and
   wherein the third pitch of repeating is narrower than the first pitch of repeating.
2. The semiconductor device according to claim 1, wherein the third alternating conductivity type layer is doped more lightly than the first alternating conductivity type layer.
3. A semiconductor device comprising:
   a semiconductor chip having a first major surface and a second major surface facing opposite to the first major surface;
   a first electrode layer on the first major surface having a first peripheral portion;
   a second electrode layer on the second major surface;
   an active region in a vicinity of the first major surface, the active region being in electrical contact with the first electrode layer;
   a layer with low electrical resistance of a first conductivity type in a vicinity of the second major surface, the layer with low electrical resistance being in electrical contact with the second electrode layer;

a drain drift region between the first major surface and the layer with low electrical resistance, the drain drift region providing a vertical drift current path in the ON-state of the semiconductor device, the drain drift region being depleted in the OFF-state of the semiconductor device, wherein the drain drift region comprises a first alternating conductivity type layer comprising vertically extending first semiconductor regions of the first conductivity type and vertically extending second semiconductor regions of a second conductivity type arranged alternately at a first pitch of repeating;

a breakdown withstanding region around the drain drift region, the breakdown withstanding region being between the first major surface and the layer with low electrical resistance, the breakdown withstanding region providing substantially no current path in the ON-state of the semiconductor device, the breakdown withstanding region being depleted in the OFF-state of the semiconductor device, the breakdown withstanding region comprising a second alternating conductivity type layer comprising vertically extending third semiconductor regions of the first conductivity type and vertically extending fourth semiconductor regions of the second conductivity type arranged alternately at a second pitch of repeating; and an under region below the first peripheral portion of the first electrode layer, the under region comprising a third alternating conductivity type layer comprising vertically extending fifth semiconductor regions of the first conductivity type and vertically extending sixth semiconductor regions of the second conductivity type arranged alternately at a third pitch of repeating;

wherein the third alternating conductivity type layer is doped more lightly than the first alternating conductivity type layer, and wherein the second pitch of repeating is narrower than the first pitch of repeating.

4. The semiconductor device according to claim 1, wherein the first electrode layer further comprises a second peripheral portion, under which the second alternating conductivity type layer is extended.

5. The semiconductor device according to claim 3, wherein the first electrode layer further comprises a second peripheral portion, under which the second alternating conductivity type layer is extended.

6. The semiconductor device according to claim 1, wherein the second pitch of repeating is narrower than the first pitch of repeating.

7. The semiconductor device according to claim 1, wherein the second alternating conductivity type layer is doped more lightly than the first alternating conductivity type layer.

8. The semiconductor device according to claim 3, wherein the second alternating conductivity type layer is doped more lightly than the first alternating conductivity type layer.

9. The semiconductor device according to claim 1, further comprising a first well region of the second conductivity type connected electrically to the first electrode layer, the first well region covering the surface of the third alternating conductivity type layer on the side of the first major surface.

10. The semiconductor device according to claim 3, further comprising a first well region of the second conductivity type connected electrically to the first electrode layer, the first well region covering a surface of the third alternating conductivity type layer on the side of the first major surface.

11. The semiconductor device according to claim 4, further comprising a second well region of the second conductivity type connected electrically to the first electrode layer, the second well region covering a surface of the extended portion of the second alternating conductivity type layer on the side of the first major surface.

12. The semiconductor device according to claim 5, further comprising a second well region of the second conductivity type connected electrically to the first electrode layer, the second well region covering a surface of the extended portion of the second alternating conductivity type layer on the aide of the first major surface.

13. The semiconductor device according to claim 9, wherein the innermost second semiconductor region or the outermost second semiconductor region of the first alternating conductivity type layer in contact with the outermost fifth semiconductor region or the innermost fifth semiconductor region of the third alternating conductivity type layer is connected to the first well region of the second conductivity type.

14. The semiconductor device according to claim 10, wherein the innermost second semiconductor region or the outermost second semiconductor region of the first alternating conductivity type layer in contact with the outermost fifth semiconductor region or the innermost fifth semiconductor region of the third alternating conductivity type layer is connected to the first well region of the second conductivity type.

15. The semiconductor device according to claim 11, wherein the outermost second semiconductor region of the first alternating conductivity type layer in contact with the innermost third semiconductor region of the second alternating conductivity type layer is connected to the second well region of the second conductivity type.

16. The semiconductor device according to claim 12, wherein the outermost second semiconductor region of the first alternating conductivity type layer in contact with the innermost third semiconductor region of the second alternating conductivity type layer is connected to the second well region of the second conductivity type.

17. The semiconductor device according to claim 1, wherein the first peripheral portion of the first electrode layer is formed on a thick insulation film.

18. The semiconductor device according to claim 3, wherein the first peripheral portion of the first electrode layer is formed on a thick insulation film.

19. The semiconductor device according to claim 4, wherein the second peripheral portion of the first electrode layer comprises a field plate.

20. The semiconductor device according to claim 5, wherein the second peripheral portion of the first electrode layer comprises a field plate.

21. The semiconductor device according to claim 1, wherein the first through sixth semiconductor regions of the first through third alternating conductivity type layer are shaped with respective stripes in a plane parallel to the first major surface or the second major surface.

22. The semiconductor device according to claim 3, wherein the first through sixth semiconductor regions of the first through third alternating conductivity type layer are shaped with respective stripes in a plane parallel to the first major surface or the second major surface.

23. The semiconductor device according to claim 21, wherein the pn-junctions in the second alternating conductivity type layer extend in parallel to the pn-junctions in the first alternating conductivity type layer.

24. The semiconductor device according to claim 22, wherein the pn-junctions in the second alternating conductivity type layer extend in parallel to the pn-junctions in the first alternating conductivity type layer.

25. The semiconductor device according to claim 21, wherein the pn-junctions in the second alternating conductivity type layer extend in perpendicular to the pn-junctions in the first alternating conductivity type layer.

26. The semiconductor device according to claim 22, wherein the pn-junctions in the second alternating conductivity type layer extend in perpendicular to the pn-junctions in the first alternating conductivity type layer.

* * * * *